(12) United States Patent
Iwano et al.

(10) Patent No.: US 10,549,399 B2
(45) Date of Patent: *Feb. 4, 2020

(54) SLURRY, POLISHING-SOLUTION SET, POLISHING SOLUTION, SUBSTRATE POLISHING METHOD, AND SUBSTRATE

(71) Applicant: HITACHI CHEMICAL COMPANY, LTD., Tokyo (JP)

(72) Inventors: Tomohiro Iwano, Hitachi (JP); Hisataka Minami, Hitachi (JP); Toshiaki Akutsu, Hitachi (JP); Koji Fujisaki, Kokubunji (JP)

(73) Assignee: HITACHI CHEMCIAL COMPANY, LTD., Tokyo (JP)

( * ) Notice: Subject to any disclaimer, the term of this patent is extended or adjusted under 35 U.S.C. 154(b) by 718 days.

This patent is subject to a terminal disclaimer.

(21) Appl. No.: 14/401,233

(22) PCT Filed: Mar. 26, 2013

(86) PCT No.: PCT/JP2013/058770
§ 371 (c)(1),
(2) Date: Nov. 14, 2014

(87) PCT Pub. No.: WO2013/175854
PCT Pub. Date: Nov. 28, 2013

(65) Prior Publication Data
US 2015/0139885 A1    May 21, 2015

(30) Foreign Application Priority Data
May 22, 2012  (JP) .................................. 2012-116865

(51) Int. Cl.
| C09K 3/14 | (2006.01) |
| C09G 1/02 | (2006.01) |
| B24B 37/04 | (2012.01) |
| C01B 33/12 | (2006.01) |
| H01L 21/304 | (2006.01) |
| H01L 21/3105 | (2006.01) |

(52) U.S. Cl.
CPC ............ B24B 37/044 (2013.01); C01B 33/12 (2013.01); C09G 1/02 (2013.01); H01L 21/304 (2013.01)

(58) Field of Classification Search
CPC .................................... C09G 1/02; C09K 3/14
See application file for complete search history.

(56) References Cited

U.S. PATENT DOCUMENTS

| 3,097,083 A | 7/1963 | Silvernail |
| 3,123,452 A | 3/1964 | Harris et al. |
| 5,529,969 A | 6/1996 | Bonneau et al. |
| 5,908,800 A | 6/1999 | Bonneau et al. |
| 6,420,269 B2 | 7/2002 | Matsuzawa et al. |
| 6,440,856 B1 | 8/2002 | Bessho et al. |
| 6,589,496 B1 | 7/2003 | Yabe et al. |
| 6,786,945 B2 | 9/2004 | Machii et al. |
| 7,563,383 B2 | 7/2009 | de Rege Thesauro et al. |
| 8,075,800 B2 | 12/2011 | Koyama et al. |
| 9,346,978 B2 | 5/2016 | Iwano et al. |
| 9,881,801 B2 | 1/2018 | Iwano |
| 9,881,802 B2 | 1/2018 | Iwano |
| 9,932,497 B2 | 4/2018 | Iwano et al. |
| 9,982,177 B2 | 5/2018 | Iwano et al. |
| 9,988,573 B2 | 6/2018 | Iwano et al. |
| 10,131,819 B2 | 11/2018 | Iwano |
| 10,196,542 B2 | 2/2019 | Minami et al. |
| 2002/0016060 A1 | 2/2002 | Matsuzawa et al. |
| 2004/0065022 A1 | 4/2004 | Machii et al. |
| 2004/0084414 A1 | 5/2004 | Sakai et al. |
| 2005/0028450 A1 | 2/2005 | Xu et al. |
| 2005/0074384 A1 | 4/2005 | Yabe et al. |
| 2005/0255693 A1 | 11/2005 | Liu et al. |
| 2006/0278614 A1 | 12/2006 | Wang et al. |
| 2006/0289826 A1* | 12/2006 | Koyama ................. C09G 1/02 252/79.1 |
| 2007/0166216 A1 | 7/2007 | Chinone et al. |
| 2007/0176140 A1 | 8/2007 | Matsuda et al. |
| 2007/0181535 A1 | 8/2007 | De Rege Thesauro et al. |
| 2007/0251270 A1 | 11/2007 | Miyatani et al. |
| 2009/0104778 A1 | 4/2009 | Sakanishi et al. |
| 2009/0318063 A1 | 12/2009 | Misra |
| 2010/0107509 A1 | 5/2010 | Guiselin |
| 2011/0006251 A1 | 1/2011 | Chinone et al. |
| 2011/0039475 A1 | 2/2011 | Hoshi et al. |
| 2011/0275217 A1 | 11/2011 | Satou et al. |
| 2011/0275285 A1 | 11/2011 | Satou et al. |
| 2012/0108064 A1 | 5/2012 | Suzuki et al. |
| 2012/0156874 A1 | 6/2012 | Han et al. |
| 2012/0282775 A1 | 11/2012 | Kim et al. |
| 2012/0299158 A1 | 11/2012 | Shinoda et al. |
| 2012/0322346 A1 | 12/2012 | Iwano et al. |
| 2012/0329370 A1 | 12/2012 | Iwano et al. |
| 2015/0098887 A1 | 4/2015 | Iwano et al. |
| 2015/0139885 A1 | 5/2015 | Iwano et al. |
| 2016/0222252 A1 | 8/2016 | Minami et al. |

FOREIGN PATENT DOCUMENTS

| CN | 1384170 A | 12/2002 |
| CN | 1457506 A | 11/2003 |

(Continued)

OTHER PUBLICATIONS

"Synthetic and optical properties of nanostructured Ce(Oh)4" to Ansari published in Journal of Semiconductors, vol. 31, No. 3, Mar. 2010.*

(Continued)

Primary Examiner — Pegah Parvini
(74) Attorney, Agent, or Firm — Fitch, Even, Tabin & Flannery, L.L.P.

(57) ABSTRACT

A polishing liquid comprising an abrasive grain, an additive, and water, wherein the abrasive grain includes a hydroxide of a tetravalent metal element, and produces absorbance of 1.00 or more and less than 1.50 for light having a wavelength of 400 nm in an aqueous dispersion having a content of the abrasive grain adjusted to 1.0 mass %.

35 Claims, 2 Drawing Sheets

(56) References Cited

FOREIGN PATENT DOCUMENTS

| | | |
|---|---|---|
| CN | 1524917 A | 9/2004 |
| CN | 1610963 A | 4/2005 |
| CN | 1746255 A | 3/2006 |
| CN | 1795543 A | 6/2006 |
| CN | 1290162 C | 12/2006 |
| CN | 1935927 A | 3/2007 |
| CN | 1948418 A | 4/2007 |
| CN | 101395097 A | 3/2009 |
| CN | 101611476 A | 12/2009 |
| CN | 101649182 A | 2/2010 |
| CN | 102017091 A | 4/2011 |
| CN | 102408836 A | 4/2012 |
| EP | 0541158 A1 | 5/1993 |
| EP | 0992456 A1 | 4/2000 |
| EP | 1369906 A1 | 12/2003 |
| JP | 8-22970 A | 1/1996 |
| JP | 9-270402 | 10/1997 |
| JP | 10-106994 A | 4/1998 |
| JP | 2000-160138 A | 6/2000 |
| JP | 2002-241739 A | 8/2002 |
| JP | 2002-329688 A | 11/2002 |
| JP | 2004-155913 A | 6/2004 |
| JP | 2005-175432 A | 6/2005 |
| JP | 2006-182604 | 7/2006 |
| JP | 2006-249129 A | 9/2006 |
| JP | 2008-91524 A | 4/2008 |
| JP | 2008-112990 A | 5/2008 |
| JP | 2008-199043 | 8/2008 |
| JP | 2008-290183 | 12/2008 |
| JP | 2009-010402 A | 1/2009 |
| JP | 2009-067627 | 4/2009 |
| JP | 2009-099819 A | 5/2009 |
| JP | 2009-212378 | 9/2009 |
| JP | 2009-290188 A | 12/2009 |
| JP | 2010-16064 | 1/2010 |
| JP | 2010-505735 | 2/2010 |
| JP | 2010-141288 | 6/2010 |
| JP | 2010-153781 | 7/2010 |
| JP | 2010-153782 | 7/2010 |
| JP | 2010-158747 | 7/2010 |
| JP | 2011-97050 A | 5/2011 |
| JP | 2011-151405 A | 8/2011 |
| JP | 2012-084906 | 4/2012 |
| KR | 10-2002-0086953 | 11/2002 |
| KR | 10-2011-0007142 | 1/2011 |
| KR | 10-2012-0024881 | 3/2012 |
| TW | 201132749 A | 10/2011 |
| WO | 02/067309 A1 | 8/2002 |
| WO | WO 2007/055278 A1 | 5/2007 |
| WO | 2009/131133 A1 | 10/2009 |
| WO | 2010/067844 A1 | 6/2010 |
| WO | WO 2010/143579 A1 | 12/2010 |
| WO | 2011/071168 A1 | 6/2011 |
| WO | 2011/111421 A1 | 9/2011 |
| WO | 2012/070541 A1 | 5/2012 |
| WO | 2012/070542 A1 | 5/2012 |

OTHER PUBLICATIONS

Communication issued in connection with Corresponding PCT Application No. PCT/JP2013/058770, dated Dec. 4, 2014.
Office Action dated Aug. 25, 2015, for Japanese Application No. 2014-516704, 7 pages.
Office Action dated Mar. 10, 2016, for Chinese Application No. 201380026259.7.
U.S. Office Action dated Nov. 27, 2015, for U.S. Appl. No. 13/582,969.
U.S. Office Action dated Oct. 9, 2014, for U.S. Appl. No. 13/582,969.
U.S. Office Action dated Sep. 16, 2015, for U.S. Appl. No. 13/582,969.
U.S. Office Action dated Sep. 17, 2013, for U.S. Appl. No. 13/582,969.
U.S. Office Action dated May 20, 2014, for U.S. Appl. No. 13/756,456.
U.S. Office Action dated Mar. 27, 2013, for U.S. Appl. No. 13/582,961.
English translation of PCT/ISA/237 in connection with No. PCT/JP2011/076827.
Japanese claims from PCT/JP2011/076827.
Certified English translation of claims from PCT/JP2011/076827.
English language mechanical translation of JP 2010153782 A.
Office Action dated Aug. 25, 2015, for Japanese Application No. 2014-516708.
U.S. Office Action dated May 6, 2014, for U.S. Appl. No. 13/582,961.
Communication dated Feb. 11, 2014 in connection with CN Patent Application No. 201180005050.3.
Communication dated Jul. 30, 2013 in connection with JP Patent Application No. 2012-504347.
Communication dated Jun. 20, 2013 in connection with International Application No. PCT/JP2011/076822.
Communication dated Jun. 20, 2013 in connection with International Application No. PCT/JP2011/076827.
Communication dated Jun. 20, 2013 in connection with International Application No. PCT/JP2011/076830.
Communication dated May 13, 2014 in connection with CN Application No. 201180055799.9.
Communication dated May 19, 2015 in connection with CN Application No. 201180055798.4.
Communication dated May 28, 2014 in connection with CN Application No. 201310317864.1.
Communication dated Jul. 10, 2014 in connection with CN Patent Application No. 201310335723.2.
Communication issued in connection with PCT Application No. PCT/JP2013/058782, dated Dec. 4, 2014.
Communication issued in connection with PCT Application No. PCT/JP2013/058831, dated Dec. 4, 2014.
Communication issued in connection with TW Application No. 102110935 dated Dec. 2, 2014.
International Search Report dated Jul. 2, 2013 in connection with International Application No. PCT/JP2013/058782.
Certified English translation of claims from PCT/JP2011/076822.
English translation of PCT/ISA/237 in connection with PCT/JP2011/076822.
Japanese claims from PCT/JP2011/076822.
JP Office Action of Application No. 2014-146000 dated Jun. 2, 2015.
Office Action in CN Application No. 201380026857.4 dated Aug. 6, 2015.
Office Action in JP Application No. 2014-516705 dated Aug. 25, 2015.
Office Action dated Jul. 28, 2015 for JP Application No. 2013-098585.
Office Action dated Jul. 28, 2015 for JP Application No. 2013-098705.
Office Action dated Jun. 6, 2016 for TW Application No. 102112787.
Office Action dated Jun. 6, 2016 for TW Application No. 102112789.
Office Action dated Mar. 2, 2016 for CN Application No. 201380026398.X.
Office Action dated Oct. 19, 2015 in CN Application No. 201310335599.X.
Skoog, Douglas A., et al. "Fundamentals of Analytical Chemistry", 7th ed. Saunders College Publishing, 1996, pp. 502-519.
U.S. Office Action dated Apr. 16, 2013, for U.S. Appl. No. 13/582,969.
U.S. Office Action dated Apr. 27, 2015, for U.S. Appl. No. 13/582,969.
U.S. Office Action dated Apr. 8, 2014, for U.S. Appl. No. 13/582,969.
U.S. Office Action dated Aug. 12, 2015, for U.S. Appl. No. 14/401,246.
U.S. Office Action dated Dec. 11, 2013, for U.S. Appl. No. 13/582,972.
U.S. Office Action dated Dec. 13, 2016, for U.S. Appl. No. 13/575,078.
U.S. Office Action dated Dec. 13, 2016, for U.S. Appl. No. 13/755,024.
U.S. Office Action dated Dec. 16, 2015, for U.S. Appl. No. 13/575,078.
U.S. Office Action dated Dec. 18, 2013, for U.S. Appl. No. 13/755,024.
U.S. Office Action dated Dec. 31, 2013, for U.S. Appl. No. 13/575,078.
U.S. Office Action dated Dec. 6, 2016, for U.S. Appl. No. 13/582,972.
U.S. Office Action dated Feb. 10, 2016, for U.S. Appl. No. 14/401,246.
U.S. Office Action dated Feb. 11, 2016, for U.S. Appl. No. 13/582,969.
U.S. Office Action dated Feb. 17, 2016, for U.S. Appl. No. 13/755,024.
U.S. Office Action dated Jun. 17, 2015, for U.S. Appl. No. 13/575,078.
U.S. Office Action dated Jun. 19, 2015, for U.S. Appl. No. 13/755,024.

(56) References Cited

OTHER PUBLICATIONS

U.S. Office Action dated Jun. 4, 2013, for U.S. Appl. No. 13/755,024.
U.S. Office Action dated May 17, 2016, for U.S. Appl. No. 14/401,246.
U.S. Office Action dated May 19, 2015, for U.S. Appl. No. 13/582,972.
U.S. Office Action dated May 30, 2013, for U.S. Appl. No. 13/582,972.
U.S. Office Action dated May 31, 2013, for U.S. Appl. No. 13/575,078.
U.S. Office Action dated Nov. 2, 2015, for U.S. Appl. No. 13/582,972.
U.S. Office Action dated Nov. 2, 2016, for U.S. Appl. No. 14/401,283.
Office Action dated Jun. 6, 2016, for Taiwanese Application No. 102112791.
Communication dated May 21, 2013, in connection with PCT/JP2013/053558.
Communication dated Sep. 4, 2014, in connection with PCT/JP2013/053558.
Communication dated May 21, 2013, in connection with PCT/JP2013/053559.
Communication dated Sep. 4, 2014, in connection with PCT/JP2013/053559.
Notice of Allowance dated Oct. 18, 2016, for Japanese Application No. 2014-500686.
Notice of Allowance in U.S. Appl. No. 14/379,947 dated Jan. 21, 2016.
Office Action dated Aug. 16, 2016 for Japanese Application No. 2014-500686.
Office Action dated Jan. 4 ,2016 for Chinese Application No. 201380010364.1.
Office Action dated Aug. 16, 2016, for Japanese Application No. 2014-500685.
English Translation of International Preliminary Report of Appln. No. PCT/JP2011/050991 dated Oct. 11, 2012.
Office Action dated Jul. 10, 2019 in U.S. Appl. No. 14/379,954.

\* cited by examiner

SLURRY, POLISHING-SOLUTION SET, POLISHING SOLUTION, SUBSTRATE POLISHING METHOD, AND SUBSTRATE

TECHNICAL FIELD

The present invention relates to a slurry, a polishing-liquid set, a polishing liquid, a base substrate polishing method and a base substrate. In particular, the present invention relates to a slurry, a polishing-liquid set, a polishing liquid, a base substrate polishing method and a base substrate, used in manufacturing steps of semiconductor elements.

BACKGROUND ART

In manufacturing steps of semiconductor elements of recent years, processing techniques for densification and miniaturization are becoming increasingly important. CMP (Chemical Mechanical Polishing) technique, as one of the processing techniques, has become an essential technique for forming Shallow Trench Isolation (hereinafter, referred to as "STI" in some cases), flattening pre-metal insulating materials or interlayer insulating materials, and forming plugs or embedded metal wires, in manufacturing steps of semiconductor elements.

Conventionally, in manufacturing steps of semiconductor elements, insulating materials such as silicon oxide, which are formed by a CVD (Chemical Vapor Deposition) method, a spin-coating method or the like, are flattened by CMP. In the CMP, silica-based polishing liquids comprising silica particles such as colloidal silica and fumed silica as abrasive grains are generally used. The silica-based polishing liquids are manufactured by performing grain growth of abrasive grains by methods such as thermal decomposition of silicon tetrachloride and adjusting pH. However, these silica-based polishing liquids have a technical problem of a low polishing rate.

Incidentally, STI is used for element isolation in integrated circuits in the generation after a design rule of 0.25 μm. In STI formation, CMP is used for removing an extra part of an insulating material deposited on a base substrate. In order to stop polishing in CMP, a stopper (polishing stop layer) having a slow polishing rate is formed under the insulating material. Silicon nitride, polysilicon or the like is used for a stopper material (constituent material of stopper), and the polishing selection ratio of the insulating material with respect to the stopper material (polishing rate ratio: polishing rate of insulating material/polishing rate of stopper material) is desirably high. Conventional silica-based polishing liquids have a low polishing selection ratio of the insulating material with respect to the stopper material, about 3, and tend not to have properties which can withstand practical use for STI.

Moreover, in recent years, as cerium oxide-based polishing liquids, polishing liquids for semiconductors, using high-purity cerium oxide particles, have been used (for example, refer to the following Patent Literature 1).

Incidentally, in recent years, achievement of further miniaturization of wires has been required in manufacturing steps of semiconductor elements, and polishing scratch generated during polishing have become a problem. Specifically, when polishing is performed using conventional cerium oxide-based polishing liquids, generation of fine polishing scratch gives no problem as long as the size of the polishing scratch is smaller than the conventional wire width, but becomes a problem in the case where further miniaturization of wires is tried to be achieved.

For this problem, in the above-described cerium oxide-based polishing liquids, the average particle diameter of cerium oxide particles is tried to be reduced. However, if the average particle diameter is reduced, the polishing rate may be decreased due to a decrease in the mechanical action. Even if both a polishing rate and polishing scratch are tried to be achieved by controlling the average particle diameter of cerium oxide particles in this manner, it is extremely difficult to achieve the exacting requirement of recent years for polishing scratch while maintaining a polishing rate.

In response to this, polishing liquids using particles of a hydroxide of a tetravalent metal element have been studied (for example, refer to the following Patent Literature 2). Moreover, manufacturing methods of particles of a hydroxide of a tetravalent metal element have also been studied (for example, refer to the following Patent Literature 3). These techniques aim at reducing polishing scratch due to particles, by minimizing the mechanical action as much as possible while maintaining the chemical action of the particles of a hydroxide of a tetravalent metal element.

Furthermore, other than reducing of polishing scratch, a base substrate having irregularities is required to be flatly polished. Using the above-described STI as an example, the polishing selection ratio of the insulating material that is a material to be polished (for example, silicon oxide) is required to be improved with respect to the polishing rate of the stopper material (for example, silicon nitride, polysilicon). In order to solve them, addition of various additives to polishing liquids has been studied. For example, a technique for improving the polishing selection ratio in a base substrate having wires with different wire densities in the same plane by adding additives to polishing liquids is known (for example, refer to the following Patent Literature 4). Moreover, addition of additives to cerium oxide-based polishing liquids for controlling the polishing rate and improving global flatness is known (for example, refer to the following Patent Literature 5).

CITATION LIST

Patent Literature

Patent Literature 1: Japanese Patent Application Laid-Open No. 10-106994
Patent Literature 2: International Publication No. WO 02/067309
Patent Literature 3: Japanese Patent Application Laid-Open No. 2006-249129
Patent Literature 4: Japanese Patent Application Laid-Open No. 2002-241739
Patent Literature 5: Japanese Patent Application Laid-Open No. 08-022970

SUMMARY OF INVENTION

Technical Problem

However, it could not be said that the polishing rate is sufficiently high while reducing polishing scratch, by the techniques described in Patent Literatures 2 and 3. Since the polishing rate affects the efficiency of manufacturing processes, polishing liquids having a higher polishing rate are required.

Moreover, in conventional polishing liquids, if the polishing liquids comprise additives, the polishing rate is sometimes reduced in replacement of obtaining an addition effect of an additive, and there is a problem in that achievement of both a polishing rate and other polishing properties is difficult.

Furthermore, in conventional polishing liquids, storage stability is sometimes low. For example, there is a problem in that polishing properties are changed with time to be drastically decreased (stability of the polishing properties are low). Typical examples of the above-described polishing properties include a polishing rate, and there is a problem in that the polishing rate is decreased with time (stability of the polishing rate is low). Moreover, aggregation and precipitation of abrasive grains during storing occur, and these sometimes adversely affect the polishing properties (dispersion stability is low).

The present invention aims to solve the above-described problems, and it is an object of the present invention to provide a slurry capable of obtaining a polishing liquid which can polish a material to be polished at an excellent polishing rate while maintaining an addition effect of an additive and can improve storage stability.

Moreover, it is an object of the present invention to provide a polishing-liquid set and a polishing liquid which can polish a material to be polished at an excellent polishing rate while maintaining an addition effect of an additive and can improve storage stability.

Furthermore, it is an object of the present invention to provide a base substrate polishing method using the above-described slurry, the above-described polishing-liquid set, or the above-described polishing liquid, and a base substrate obtained thereby.

Solution to Problem

The present inventors made extensive research on a slurry using the abrasive grain including a hydroxide of a tetravalent metal element, and as a result, found that a material to be polished can be polished at an excellent polishing rate and high storage stability can be achieved by using the abrasive grain having light absorption (absorbance) for light having a specific wavelength within a specific range, in an aqueous dispersion comprising a specific amount of the abrasive grain. Moreover, it was found that, in the case where a polishing liquid obtained by adding an additive to such a slurry is used, a material to be polished can be polished at an excellent polishing rate while maintaining an addition effect of an additive, and high storage stability can be achieved.

Specifically, the slurry of the present invention is a slurry comprising an abrasive grain, and water, wherein the abrasive grain includes a hydroxide of a tetravalent metal element, and produces absorbance of 1.00 or more and less than 1.50 for light having a wavelength of 400 nm in an aqueous dispersion having a content of the abrasive grain adjusted to 1.0 mass %.

According to the slurry of the present invention, in the case where a polishing liquid obtained by adding an additive to the slurry is used, a material to be polished can be polished at an excellent polishing rate while maintaining an addition effect of an additive, and storage stability can be improved. In this case, as a polishing liquid which excels in storage stability, in particular, a polishing liquid which excels in dispersion stability and also excels in stability of a polishing rate can be obtained. Moreover, in the case where the slurry of the present invention is used for polishing without adding an additive, a material to be polished can be polished at an excellent polishing rate, and storage stability can also be improved. In this case, as a slurry which excels in storage stability, in particular, a slurry which excels in dispersion stability and also excels in stability of a polishing rate can be obtained. Furthermore, according to the slurry of the present invention, the abrasive grain includes a hydroxide of a tetravalent metal element so that generation of polishing scratch on a surface to be polished can also be suppressed.

The present inventors further made extensive research on the slurry using the abrasive grain including a hydroxide of a tetravalent metal element, and as a result, found that, in the case where the above-described abrasive grain can increase light transmittance for light having a wavelength of 500 nm, a material to be polished can be polished at a further excellent polishing rate and further high storage stability can be achieved. Specifically, in the slurry of the present invention, the abrasive grain preferably produce light transmittance of 50%/cm or more, and more preferably produce light transmittance of 95%/cm or more, for light having a wavelength of 500 nm in an aqueous dispersion having a content of the abrasive grain adjusted to 1.0 mass %.

The present inventors further made extensive research on the slurry using the abrasive grain including a hydroxide of a tetravalent metal element, and as a result, found that, in the case where the above-described abrasive grain can increase absorbance for light having a wavelength of 290 nm, a material to be polished can be polished at a further excellent polishing rate and further high storage stability can be achieved. Specifically, in the slurry of the present invention, the abrasive grain preferably produce absorbance of 1.000 or more for light having a wavelength of 290 nm in an aqueous dispersion having a content of the abrasive grain adjusted to 0.0065 mass % (65 ppm). It is to be noted that "ppm" means mass ppm, that is, "parts per million mass".

In the slurry of the present invention, the abrasive grain preferably produce absorbance of 0.010 or less for light having a wavelength of 450 to 600 nm in an aqueous dispersion having a content of the abrasive grain adjusted to 0.0065 mass %. In this case, a material to be polished can be polished at a further excellent polishing rate and storage stability can be improved.

The hydroxide of a tetravalent metal element is preferably obtained by reacting a salt of a tetravalent metal element with an alkali source. In this case, a particle having an extremely fine particle diameter can be obtained as an abrasive grain, and thus, a polishing scratch reducing effect can be further improved.

The tetravalent metal element is preferably tetravalent cerium. In this case, a fine particle having high chemical activity can be obtained as an abrasive grain, and thus, a material to be polished can be polished at a further excellent polishing rate.

Moreover, the present inventors found that, in a polishing liquid comprising an additive in addition to the constituent components of the above-described slurry, a reduction in a polishing rate of a material to be polished due to the addition of the additive can be suppressed by using the above-described abrasive grain having absorbance for light having a wavelength of 400 nm within a specific range.

Specifically, in the polishing-liquid set of the present invention, constituent components of a polishing liquid are separately stored as a first liquid and a second liquid such that the first liquid and the second liquid are mixed to form the polishing liquid, the first liquid is the above-described slurry, and the second liquid comprises an additive and water. According to the polishing-liquid set of the present invention, a material to be polished can be polished at an excellent polishing rate while maintaining an addition effect of an additive, and storage stability can be improved. According to the polishing-liquid set of the present invention, generation of polishing scratch can also be suppressed.

The additive is preferably at least one selected from the group consisting of vinyl alcohol polymers and derivatives of the vinyl alcohol polymers. In this case, the additive covers the surface of the abrasive grain, and thus, adhesion of the abrasive grain to a surface to be polished is suppressed, and therefore, dispersibility of the abrasive grain is improved and stability of the polishing liquid can be further improved. Moreover, washability of the surface to be polished can also be improved. Furthermore, by suppressing the polishing rate of a stopper material, the polishing selection ratio of an insulating material with respect to the stopper material (polishing rate of insulating material/polishing rate of stopper material) can be improved.

The content of the additive is preferably 0.01 mass % or more based on the total mass of the polishing liquid. In this case, an addition effect of an additive can be significantly obtained, and storage stability can be improved.

The polishing liquid of the present invention is a polishing liquid comprising an abrasive grain, an additive, and water, wherein the abrasive grain includes a hydroxide of a tetravalent metal element, and produces absorbance of 1.00 or more and less than 1.50 for light having a wavelength of 400 nm in an aqueous dispersion having a content of the abrasive grain adjusted to 1.0 mass %. According to the polishing liquid of the present invention, a material to be polished can be polished at an excellent polishing rate while maintaining an addition effect of an additive, and storage stability can be improved. In this case, as a polishing liquid which excels in storage stability, in particular, a polishing liquid which excels in dispersion stability and also excels in stability of a polishing rate can be obtained. According to the polishing liquid of the present invention, the abrasive grain includes a hydroxide of a tetravalent metal element so that generation of polishing scratch on a surface to be polished can also be suppressed.

In the polishing liquid of the present invention, the abrasive grain preferably produce light transmittance of 50%/cm or more, and more preferably produce light transmittance of 95%/cm or more, for light having a wavelength of 500 nm in an aqueous dispersion having a content of the abrasive grain adjusted to 1.0 mass %. In these cases, a material to be polished can be polished at a further excellent polishing rate and storage stability can be further improved.

In the polishing liquid of the present invention, the abrasive grain preferably produce absorbance of 1.000 or more for light having a wavelength of 290 nm in an aqueous dispersion having a content of the abrasive grain adjusted to 0.0065 mass % (65 ppm). In this case, a material to be polished can be polished at a further excellent polishing rate and storage stability can be further improved.

In the polishing liquid of the present invention, the abrasive grain preferably produce absorbance of 0.010 or less for light having a wavelength of 450 to 600 nm in an aqueous dispersion having a content of the abrasive grain adjusted to 0.0065 mass %. In this case, a material to be polished can be polished at a further excellent polishing rate and storage stability can be improved.

In the polishing liquid of the present invention, the hydroxide of a tetravalent metal element is preferably obtained by reacting a salt of a tetravalent metal element with an alkali source. In this case, a particle having an extremely fine particle diameter can be obtained as an abrasive grain, and thus, a polishing scratch reducing effect can be further improved.

In the polishing liquid of the present invention, the tetravalent metal element is preferably tetravalent cerium. In this case, a fine particle having high chemical activity can be obtained as an abrasive grain, and thus, a material to be polished can be polished at a further excellent polishing rate.

In the polishing liquid of the present invention, the additive is preferably at least one selected from the group consisting of vinyl alcohol polymers and derivatives of the vinyl alcohol polymers. In this case, the additive covers the surface of the abrasive grain, and thus, adhesion of the abrasive grain to a surface to be polished is suppressed, and therefore, dispersibility of the abrasive grain is improved and stability of the polishing liquid can be further improved. Moreover, washability of the surface to be polished can also be improved. Furthermore, by suppressing the polishing rate of a stopper material, the polishing selection ratio of an insulating material with respect to the stopper material (polishing rate of insulating material/polishing rate of stopper material) can be improved.

In the polishing liquid of the present invention, the content of the additive is preferably 0.01 mass % or more based on the total mass of the polishing liquid. In this case, an addition effect of an additive can be significantly obtained, and storage stability can be improved.

Moreover, the present invention provides base substrate polishing methods using the above-described slurry, the above-described polishing-liquid set, or the above-described polishing liquid. According to these polishing methods, a material to be polished can be polished at an excellent polishing rate, and storage stability can be improved. According to these polishing methods, generation of polishing scratch can be suppressed, and a base substrate which excels in flatness can also be obtained.

A first embodiment of the polishing methods of the present invention relates to a polishing method using the above-described slurry. Specifically, the polishing method of the first embodiment comprises a step of arranging a material to be polished of a base substrate having the material to be polished on the surface so as to be opposed to a polishing pad, and a step of polishing at least a part of the material to be polished by supplying the above-described slurry between the polishing pad and the material to be polished.

Second and third embodiments of the polishing methods of the present invention relate to polishing methods using the above-described polishing-liquid set. According to these polishing methods, problems such as aggregation of the abrasive grains and a change in polishing properties, which are concerned in the case of storing for a long time after mixing the additive, can be avoided.

Specifically, the polishing method of the second embodiment comprises a step of arranging a material to be polished of a base substrate having the material to be polished on the surface so as to be opposed to a polishing pad, a step of obtaining the polishing liquid by mixing the first liquid and the second liquid of the above-described polishing-liquid set, and a step of polishing at least a part of the material to be polished by supplying the polishing liquid between the polishing pad and the material to be polished. The polishing method of the third embodiment comprises a step of arranging a material to be polished of a base substrate having the material to be polished on the surface so as to be opposed to a polishing pad, and a step of polishing at least a part of the material to be polished by supplying each of the first liquid and the second liquid of the above-described polishing-liquid set between the polishing pad and the material to be polished.

A fourth embodiment of the polishing methods of the present invention relates to a polishing method using the above-described polishing liquid. Specifically, the polishing method of the fourth embodiment comprises a step of arranging a material to be polished of a base substrate having the material to be polished on the surface so as to be opposed to a polishing pad, and a step of polishing at least a part of the material to be polished by supplying the above-described polishing liquid between the polishing pad and the material to be polished.

The material to be polished preferably includes silicon oxide. Moreover, irregularities are preferably formed on the surface of the material to be polished. According to these polishing methods, features of the slurry, the polishing-liquid set and the polishing liquid can be sufficiently exploited.

The base substrate of the present invention is polished by the above-described polishing methods.

Advantageous Effects of Invention

According to the slurry of the present invention, a polishing liquid, which can polish a material to be polished at an excellent polishing rate while maintaining an addition effect of an additive and can improve storage stability, can be obtained. Moreover, according to the slurry of the present invention, a material to be polished can be polished at an excellent polishing rate and storage stability can also be improved. According to the polishing-liquid set and the polishing liquid of the present invention, a material to be polished can be polished at an excellent polishing rate while maintaining an addition effect of an additive and storage stability can be improved. Furthermore, the polishing methods of the present invention excel in throughput because of capable of polishing a material to be polished at an excellent polishing rate, and can satisfy intended properties (for example, flatness, selectivity) in the case of using an additive. It is to be noted that, regarding the above-described storage stability, according to the present invention, even in the case where polishing is performed using the slurry, the polishing-liquid set, and the polishing liquid after being stored at 60° C. for 3 days (72 hours), for example, a polishing rate change ratio can be decreased based on the polishing rate before storing (for example, kept within 5.0%).

Moreover, according to the present invention, uses of the above-described slurry, polishing-liquid set and polishing liquid for a flattening step of a base substrate surface in manufacturing steps of semiconductor elements are provided. In particular, according to the present invention, uses of the above-described slurry, polishing-liquid set and polishing liquid for a flattening step of shallow trench isolation insulating materials, pre-metal insulating materials, inter-layer insulating materials or the like are provided.

DESCRIPTION OF EMBODIMENTS

Figure 1:
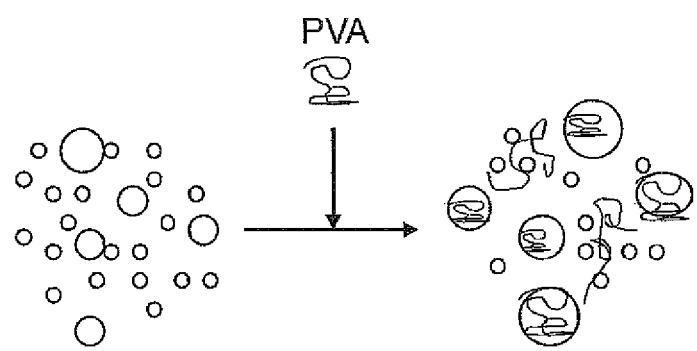
FIG. 1 is a schematic diagram showing the aggregated condition of abrasive grains when an additive is added.

Hereinafter, embodiments of the present invention will be described in detail. It is to be noted that the present invention is not limited to the following embodiments and may be embodied in various ways within the scope of the present invention. In the present description, a "slurry" and a "polishing liquid" are compositions which contact a material to be polished during polishing, and comprise at least water and abrasive grains. Moreover, an "aqueous dispersion" having a content of the abrasive grains adjusted to a predetermined amount means a liquid comprising a predetermined amount of the abrasive grains and water.

In the present embodiment, the abrasive grains include a hydroxide of a tetravalent metal element, and produce absorbance of 1.00 or more and less than 1.50 for light having a wavelength of 400 nm in an aqueous dispersion having a content of the abrasive grains adjusted to 1.0 mass %. The present inventors found that a material to be polished can be polished at an excellent polishing rate and storage stability can be improved by using the abrasive grains which satisfy the above-described conditions regarding the absorbance for light having a wavelength of 400 nm.

It is to be noted that, before finding these knowledge, the present inventors obtained the following knowledge. Specifically, the present inventors made extensive research on a slurry using abrasive grains including a hydroxide of a tetravalent metal element, and as a result, found that the polishing rate of a material to be polished becomes easy to be adjusted by using abrasive grains capable of increasing absorbance for light having a specific wavelength in an aqueous dispersion comprising a specific amount of the abrasive grains, and furthermore, found that a material to be polished can be polished at a particularly excellent polishing rate by using abrasive grains which produce absorbance of 1.50 or more for light having a wavelength of 400 nm in an aqueous dispersion having a content of the abrasive grains adjusted to 1.0 mass %. Moreover, the present inventors found that a polishing liquid and a slurry which satisfy the above-described conditions have slightly yellowishness when visually observed, and that a polishing rate is improved as the yellowishness of the polishing liquid and the slurry becomes deep.

In response to this, the present inventors further studied about abrasive grains including a hydroxide of a tetravalent metal element from the viewpoint of achieving both a polishing rate and storage stability at a high level, and conceived the use of the abrasive grains which produce absorbance of 1.00 or more and less than 1.50 for light having a wavelength of 400 nm in an aqueous dispersion having a content of the abrasive grains adjusted to 1.0 mass %, as mentioned above.

<Polishing Liquid>

The polishing liquid of the present embodiment comprises at least abrasive grains, an additive and water. Hereinafter, each of the constituent components will be described.

(Abrasive Grains)

The abrasive grains are characterized by including a hydroxide of a tetravalent metal element. The "hydroxide of a tetravalent metal element" is a compound including a tetravalent metal ($M^{4+}$) and at least one hydroxide ion ($OH^-$). The hydroxide of a tetravalent metal element may include an anion other than the hydroxide ion (for example, nitrate ion $NO_3^-$, sulfate ion $SO_4^{2-}$). For example, the hydroxide of a tetravalent metal element may include an anion (for example, nitrate ion $NO_3^-$, sulfate ion $SO_4^{2-}$) bonded to the tetravalent metal element.

The tetravalent metal element is preferably at least one selected from the group consisting of rare earth elements and zirconium. From the viewpoint of further improving a polishing rate, the tetravalent metal element is preferably rare earth elements. Examples of rare earth elements which can be tetravalent include lanthanoids such as cerium, praseodymium and terbium, and among them, from the viewpoint of easy availability and further excelling in a polishing rate, cerium (tetravalent cerium) is preferable. A hydroxide of a rare earth element and a hydroxide of zirconium may be used together, two or more kinds may be selected from hydroxides of rare earth elements to be used.

The polishing liquid of the present embodiment may use other kinds of abrasive grains together within a range not impairing properties of the abrasive grains including the hydroxide of a tetravalent metal element. Specifically, abrasive grains of silica, alumina, zirconia or the like may be used.

The content of the hydroxide of a tetravalent metal element in the abrasive grains is preferably 50 mass % or more, more preferably 60 mass % or more, further preferably 70 mass % or more, particularly preferably 80 mass % or more, extremely preferably 90 mass % or more, very preferably 95 mass % or more, still further preferably 98 mass % or more, and further preferably 99 mass % or more, based on the total mass of the abrasive grains. It is particularly preferable that the abrasive grains be substantially made of the hydroxide of a tetravalent metal element (substantial 100 mass % of the abrasive grains is particles of the hydroxide of a tetravalent metal element).

The content of the hydroxide of tetravalent cerium in the abrasive grains is preferably 50 mass % or more, more preferably 60 mass % or more, further preferably 70 mass % or more, particularly preferably 80 mass % or more, extremely preferably 90 mass % or more, very preferably 95 mass % or more, still further preferably 98 mass % or more, and further preferably 99 mass % or more, based on the total mass of the abrasive grains. It is particularly preferable that the abrasive grains be substantially made of the hydroxide of tetravalent cerium (substantial 100 mass % of the abrasive grains is particles of the hydroxide of tetravalent cerium) from the viewpoint of high chemical activity and further excelling in a polishing rate.

In the constituent components of the polishing liquid of the present embodiment, the hydroxide of a tetravalent metal element is thought to have a significant impact on polishing properties. Thus, by adjusting the content of the hydroxide of a tetravalent metal element, a chemical interaction between the abrasive grains and a surface to be polished is improved, and the polishing rate can be further improved. Specifically, the content of the hydroxide of a tetravalent metal element is preferably 0.01 mass % or more, more preferably 0.03 mass % or more, and further preferably 0.05 mass % or more, based on the total mass of the polishing liquid, from the viewpoint of making it easier to sufficiently exhibit the function of the hydroxide of a tetravalent metal element. The content of the hydroxide of a tetravalent metal element is preferably 8 mass % or less, more preferably 5 mass % or less, further preferably 3 mass % or less, particularly preferably 1 mass % or less, extremely preferably 0.5 mass % or less, and very preferably 0.3 mass % or less, based on the total mass of the polishing liquid, from the viewpoint of making it easier to avoid aggregation of the abrasive grains, and from the viewpoint of obtaining a favorable chemical interaction with the surface to be polished, and capable of effectively using properties of the abrasive grains.

In the polishing liquid of the present embodiment, the lower limit of the content of the abrasive grains is not particularly limited, but from the viewpoint of making it easier to obtain an intended polishing rate, it is preferably 0.01 mass % or more, more preferably 0.03 mass % or more, and further preferably 0.05 mass % or more, based on the total mass of the polishing liquid. The upper limit of the content of the abrasive grains is not particularly limited, but from the viewpoint of making it easier to avoid aggregation of the abrasive grains and allowing the abrasive grains to effectively act on the surface to be polished to smoothly promote polishing, it is preferably 10 mass % or less, more preferably 5 mass % or less, further preferably 3 mass % or less, particularly preferably 1 mass % or less, extremely preferably 0.5 mass % or less, and very preferably 0.3 mass % or less, based on the total mass of the polishing liquid.

In the case where the average secondary particle diameter (hereinafter referred to as "average particle diameter" unless otherwise noted) of the abrasive grains is to some extent small, the specific surface area of the abrasive grains which contact the surface to be polished is increased and thus, the polishing rate can be further improved, and the mechanical action is suppressed and thus, polishing scratch can be further reduced. Therefore, the upper limit of the average particle diameter is preferably 200 nm or less, more preferably 150 nm or less, further preferably 100 nm or less, particularly preferably 80 nm or less, extremely preferably 60 nm or less, and very preferably 40 nm or less, from the viewpoint of obtaining a further excellent polishing rate and capable of further reducing polishing scratch. The lower limit of the average particle diameter is preferably 1 nm or more, more preferably 2 nm or more, and further preferably 3 nm or more, from the viewpoint of obtaining a further excellent polishing rate and capable of further reducing polishing scratch.

The average particle diameter of the abrasive grains can be measured by the photon correlation method, and specifically, can be measured using, for example, device name: Zetasizer 3000HS manufactured by Malvern Instruments Ltd., device name: N5 manufactured by Beckman Coulter, Inc. or the like. Specifically, in a measuring method using N5, for example, an aqueous dispersion having a content of the abrasive grains adjusted to 0.2 mass % is prepared, approximately 4 mL (L represents "liter", the same shall apply hereafter) of this aqueous dispersion is poured into a 1-cm square cell, and the cell is placed in the device. A value obtained by performing measurement at 25° C. with a refractive index and a viscosity of a dispersion medium adjusted to 1.33 and 0.887 mPa·s can be used as the average particle diameter of the abrasive grains.

[Absorbance]

By using the abrasive grains which produce absorbance of 1.00 or more and less than 1.50 for light having a wavelength of 400 nm in an aqueous dispersion having a content of the abrasive grains adjusted to 1.0 mass %, the polishing rate can be improved and storage stability can be improved. The reason for this is not necessarily clear, but the present inventors conjecture as follows. Specifically, it is thought that, depending on manufacturing conditions of the hydroxide of a tetravalent metal element and the like, particles including $M(OH)_a X_b$ composed of a tetravalent metal ($M^{4+}$), 1 to 3 hydroxide ions ($OH^-$), and 1 to 3 anions ($X^{c-}$) (in the formula, $a + b \times c = 4$) are generated as a part of the abrasive grains (it is to be noted that the foregoing particles are also "the abrasive grains including the hydroxide of a tetravalent metal element"). It is thought that, in $M(OH)_a X_b$, the electron-withdrawing anions ($X^{c-}$) act to improve the reactivity of the hydroxide ions and the polishing rate is improved as the abundance of $M(OH)_a X_b$ is increased. In addition, it is thought that, since the particles including $M(OH)_a X_b$ absorb light having a wavelength of 400 nm, as the abundance of $M(OH)_aX_b$ is increased and the absorbance for light having a wavelength of 400 nm is increased, the polishing rate is improved.

It is thought that the abrasive grains including the hydroxide of a tetravalent metal element can include not only $M(OH)_aX_b$ but also $M(OH)_4$, $MO_2$ and the like. Examples of the anions ($X^{c-}$) include $NO_3^-$, $SO_4^{2-}$ and the like.

It is to be noted that the inclusion of $M(OH)_aX_b$ in the abrasive grains can be confirmed by a method for detecting a peak corresponding to the anions ($X^{c-}$) with the FT-IR ATR method (Fourier transform Infra Red Spectrometer Attenuated Total Reflection Method) after washing the abrasive grains with pure water well. The existence of the anions ($X^{c-}$) can also be confirmed by the XPS method (X-ray Photoelectron Spectroscopy).

On the other hand, the calculation of structure stability of the particles including the hydroxide of a tetravalent metal element such as $M(OH)_aX_b$ (for example, $M(OH)_3X$) has shown that the structure stability of the particles is decreased as the abundance of X is increased. From the above, it is thought that, by adjusting the abundance of the above-described particles including X using the absorbance for light having a wavelength of 400 nm as an index, both a high polishing rate and high storage stability can be achieved.

The absorption peak of $M(OH)_aX_b$ (for example, $M(OH)_3X$) at a wavelength of 400 nm has been confirmed to be much smaller than the absorption peak at a wavelength of 290 nm described below. In this regard, the present inventors studied the magnitude of absorbance using an aqueous dispersion having an abrasive grain content of 1.0 mass %, which has a relatively high abrasive grain content and whose absorbance is easily detected to a greater degree, and as a result, found that a polishing rate improving effect and storage stability are excellent in the case of using abrasive grains which produce absorbance of 1.00 or more and less than 1.50 for light having a wavelength of 400 nm in such aqueous dispersion. Since the absorbance for light having a wavelength of 400 nm is thought to be derived from the abrasive grains as described above, it is indisputable that a material to be polished cannot be polished at an excellent polishing rate while maintaining storage stability with a polishing liquid comprising a substance which produces absorbance of 1.00 or more and less than 1.50 for light having a wavelength of 400 nm (for example, a pigment composition which exhibits a yellow color) in place of the abrasive grains which produce absorbance of 1.00 or more and less than 1.50 for light having a wavelength of 400 nm.

The lower limit of the absorbance for light having a wavelength of 400 nm is 1.00 or more, and from the viewpoint of achieving both a further excellent polishing rate and storage stability, it is preferably 1.05 or more, more preferably 1.10 or more, further preferably 1.15 or more, particularly preferably 1.20 or more, and extremely preferably 1.25 or more. The upper limit of the absorbance for light having a wavelength of 400 nm is less than 1.50 from the viewpoint of suppressing a reduction in storage stability (for example, stability of polishing rate when storing at 60° C. for 72 hours).

The present inventors found that a material to be polished can be polished at a further excellent polishing rate in the case where the abrasive grains produce absorbance of 1.000 or more for light having a wavelength of 290 nm in an aqueous dispersion having a content of the abrasive grains adjusted to 0.0065 mass %.

The reason why a polishing rate improving effect is obtained by using the abrasive grains which produce absorbance of 1.000 or more for light having a wavelength of 290 nm in the aqueous dispersion having a content of the abrasive grains adjusted to 0.0065 mass % is not necessarily clear, but the present inventors conjecture as follows. Specifically, particles including $M(OH)_aX_b$ (for example, $M(OH)_3X$) which are generated depending on manufacturing conditions of the hydroxide of a tetravalent metal element and the like have a calculated absorption peak at a wavelength of about 290 nm, for example, particles composed of $Ce^{4+}(OH^-)_3NO_3^-$ have an absorption peak at a wavelength of 290 nm. Thus, it is thought that, as the abundance of $M(OH)_aX_b$ is increased and the absorbance for light having a wavelength of 290 nm is increased, the polishing rate is improved. On the other hand, the calculation of structure stability of the particles has shown that the structure stability of the particles is decreased as the abundance of X is increased. From the above, it is thought that, by adjusting the abundance of the above-described particles including X using the absorbance for light having a wavelength of 400 nm and the absorbance for light having a wavelength of 290 nm as an index, the polishing rate can be further improved.

The absorbance for light having a wavelength of about 290 nm tends to be detected to a greater degree as the measuring limit is exceeded. In this regard, the present inventors studied the magnitude of absorbance using an aqueous dispersion having an abrasive grain content of 0.0065 mass %, which has a relatively low abrasive grain content and whose absorbance is easily detected to a small degree, and as a result, found that a polishing rate improving effect is excellent in the case of using abrasive grains which produce absorbance of 1.000 or more for light having a wavelength of 290 nm in such aqueous dispersion. Moreover, the present inventors found that, apart from light having a wavelength of about 400 nm which tends to make a light-absorbing substance exhibit a yellow color when being absorbed by a light-absorbing substance, as absorbance of abrasive grains for light having a wavelength of about 290 nm becomes high, yellowishness of a polishing liquid and a slurry using such abrasive grains becomes deep, and found that the polishing rate is improved as the yellowishness of the polishing liquid and the slurry becomes deep. The present inventors found that the absorbance for light having a wavelength of 290 nm in an aqueous dispersion having an abrasive grain content of 0.0065 mass % is correlated with the absorbance for light having a wavelength of 400 nm in an aqueous dispersion having an abrasive grain content of 1.0 mass %.

The lower limit of the absorbance for light having a wavelength of 290 nm is preferably 1.000 or more, more preferably 1.050 or more, further preferably 1.100 or more, particularly preferably 1.130 or more, extremely preferably 1.150 or more, and very preferably 1.180 or more, from the viewpoint of polishing a material to be polished at a further excellent polishing rate. The upper limit of the absorbance for light having a wavelength of 290 nm is not particularly limited, but it is preferably 10.000 or less, more preferably 5.000 or less, and further preferably 3.000 or less.

The hydroxide of a tetravalent metal element (for example, $M(OH)_aX_b$) tends not to have light absorption for light having a wavelength of 450 nm or more, especially for light having a wavelength of 450 to 600 nm. Therefore, from the viewpoint of suppressing adverse impacts on polishing due to inclusion of impurities and polishing a material to be polished at a further excellent polishing rate, the abrasive grains preferably produce absorbance of 0.010 or less for light having a wavelength of 450 to 600 nm in an aqueous dispersion having a content of the abrasive grains adjusted to 0.0065 mass % (65 ppm). That is, absorbance for all of light within a range of a wavelength of 450 to 600 nm preferably does not exceed 0.010 in the aqueous dispersion having a content of the abrasive grains adjusted to 0.0065 mass %. The upper limit of the absorbance for light having a wavelength of 450 to 600 nm is more preferably 0.005 or less, and further preferably 0.001 or less. The lower limit of the absorbance for light having a wavelength of 450 to 600 nm is preferably 0.

The absorbance in an aqueous dispersion can be measured, for example, using a spectrophotometer (device name: U3310) manufactured by Hitachi, Ltd. Specifically, an aqueous dispersion having a content of the abrasive grains adjusted to 1.0 mass % or 0.0065 mass % is prepared as a measuring sample. Approximately 4 mL of the measuring sample is poured into a 1-cm square cell, and the cell is placed in the device. Next, absorbance measurement is performed within a range of a wavelength of 200 to 600 nm, and the absorbance is determined from the obtained chart.

If absorbance of 1.000 or more is exhibited in the case where the absorbance for light having a wavelength of 290 nm is measured by excessively diluting such that the content of the abrasive grains is less than 0.0065 mass %, the absorbance may be screened by assuming that the absorbance is 1.000 or more in the case where the content of the abrasive grains is 0.0065 mass %. If absorbance of 0.010 or less is exhibited in the case where the absorbance for light having a wavelength of 450 to 600 nm is measured by diluting such that the content of the abrasive grains is more than 0.0065 mass %, the absorbance may be screened by assuming that the absorbance is 0.010 or less in the case where the content of the abrasive grains is 0.0065 mass %.

[Light Transmittance]

The polishing liquid of the present embodiment preferably has high transparency for visible light (it is visually transparent or nearly transparent). Specifically, the abrasive grains comprised in the polishing liquid of the present embodiment preferably produce light transmittance of 50%/cm or more for light having a wavelength of 500 nm in an aqueous dispersion having a content of the abrasive grains adjusted to 1.0 mass %. This makes it possible to further suppress a reduction in the polishing rate due to the addition of an additive, and thus, it becomes easier to obtain other properties while maintaining the polishing rate. From this viewpoint, the lower limit of the light transmittance is more preferably 60%/cm or more, further preferably 70%/cm or more, particularly preferably 80%/cm or more, extremely preferably 90%/cm or more, very preferably 95%/cm or more, still further preferably 98%/cm or more, and further preferably 99%/cm or more. The upper limit of the light transmittance is 100%/cm.

The reason why the reduction in the polishing rate can be suppressed by adjusting the light transmittance of the abrasive grains in this manner is not understood in detail, but the present inventors conjecture as follows. The action of the abrasive grains including the hydroxide of a tetravalent metal element (such as cerium) as abrasive grains is thought to more dominantly depend on the chemical action than on the mechanical action. Therefore, the number of the abrasive grains is thought to contribute to the polishing rate more than the size of the abrasive grains.

In the case where the light transmittance is low in an aqueous dispersion having a content of the abrasive grains adjusted to 1.0 mass %, it is thought that, in the abrasive grains present in the aqueous dispersion, particles having a large particle diameter (hereinafter referred to as "coarse particles") exist in relatively large numbers. When an additive (for example, polyvinyl alcohol (PVA)) is added to a polishing liquid comprising such abrasive grains, other particles aggregate around the coarse particles as nuclei, as shown in FIG. 1. It is thought that, as a result, the number of the abrasive grains which act on a surface to be polished per unit area (effective abrasive grain number) is reduced and the specific surface area of the abrasive grains which contact the surface to be polished is reduced, and thus, the reduction in the polishing rate occurs.

Figure 2:
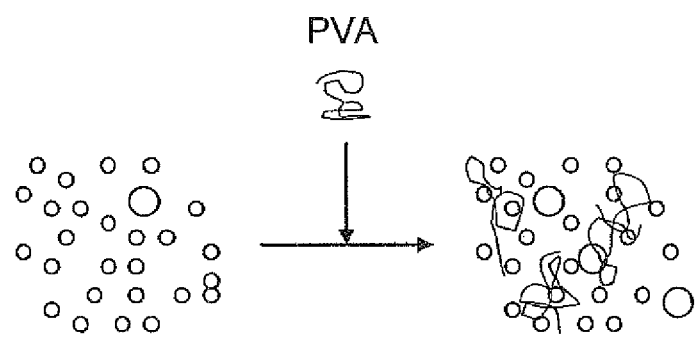
FIG. 2 is a schematic diagram showing the aggregated condition of abrasive grains when an additive is added.

On the other hand, in the case where the light transmittance is high in an aqueous dispersion having a content of the abrasive grains adjusted to 1.0 mass %, it is thought that the abrasive grains present in the aqueous dispersion are in a state where the above-described "coarse particles" are small in number. In the case where the abundance of the coarse particles is low in this manner, even when an additive (for example, polyvinyl alcohol) is added to a polishing liquid, since the coarse particles which are to be nuclei for aggregation are small in number, aggregation between abrasive grains is suppressed or the size of aggregated particles becomes smaller compared with the aggregated particles shown in FIG. 1, as shown in FIG. 2. It is thought that, as a result, the number of the abrasive grains which act on a surface to be polished per unit area (effective abrasive grain number) is maintained and the specific surface area of the abrasive grains which contact the surface to be polished is maintained, and thus, the reduction in the polishing rate becomes difficult to occur.

According to the study by the present inventors, it was found that, even among polishing liquids in which particle diameters measured by a common particle diameter measuring device are the same, some may be visually transparent (high light transmittance) and some may be visually turbid (low light transmittance). Accordingly, it is thought that the coarse particles which can produce the action described above contribute to the reduction in the polishing rate even by a very slight amount which cannot be detected by a common particle diameter measuring device.

Moreover, it was found that, even if filtration is repeated multiple times to reduce the coarse particles, a phenomenon of reducing the polishing rate due to an additive is not significantly improved, and in some cases, the above-described polishing rate improving effect due to absorbance is not sufficiently exhibited. The present inventors found that the above-described problem can be solved by using abrasive grains having high light transmittance in an aqueous dispersion, by devising a manufacturing method of the abrasive grains or the like.

The above-described light transmittance is transmittance for light having a wavelength of 500 nm. The above-described light transmittance is measured by a spectrophotometer, and specifically, is measured by a spectrophotometer U3310 (device name) manufactured by Hitachi, Ltd., for example.

As a more specific measuring method, an aqueous dispersion having a content of the abrasive grains adjusted to 1.0 mass % is prepared as a measuring sample. Approximately 4 mL of the measuring sample is poured into a 1-cm square cell, and the cell is placed in the device and measurement is performed. In the case where the light transmittance is 50%/cm or more in an aqueous dispersion having a content of the abrasive grains of more than 1.0 mass %, it is clear that the light transmittance is also 50%/cm or more in the case where it is diluted to 1.0 mass %. Therefore, the light transmittance can be screened by a simple method by using an aqueous dispersion having a content of the abrasive grains of more than 1.0 mass %.

The above-described absorbance and light transmittance which the abrasive grains produce in the aqueous dispersion preferably excel in stability. For example, after retaining the aqueous dispersion at 60° C. for 3 days (72 hours), the absorbance for light having a wavelength of 400 nm is preferably 1.00 or more and less than 1.50, the absorbance for light having a wavelength of 290 nm is preferably 1.00 or more, the absorbance for light having a wavelength of 450 to 600 nm is preferably 0.010 or less, and the light transmittance for light having a wavelength of 500 nm is preferably 50%/cm or more. Further preferred ranges of these absorbance and light transmittance are the same as the above-described ranges of the abrasive grains.

The absorbance and light transmittance which the abrasive grains comprised in the polishing liquid produce in the aqueous dispersion can be measured by, after removing solid components other than the abrasive grains and liquid components other than water, preparing an aqueous dispersion having a predetermined abrasive grain content and using the aqueous dispersion. For removing the solid components and the liquid components, although varying depending on components comprised in the polishing liquid, centrifugation methods such as centrifugation using a centrifuge capable of applying gravitational acceleration of several thousand G or less and ultracentrifugation using an ultracentrifuge capable of applying gravitational acceleration of several tens of thousands G or more; chromatography methods such as partition chromatography, adsorption chromatography, gel permeation chromatography, and ion-exchange chromatography; filtration methods such as natural filtration, filtration under reduced pressure, pressure filtration, and ultrafiltration; distillation methods such as distillation under reduced pressure and atmospheric distillation, and the like, can be used, or these may be combined as appropriate.

For example, in the case of including a compound having a weight-average molecular weight of several tens of thousands or more (for example, 50000 or more), there are chromatography methods, filtration methods and the like, and among them, gel permeation chromatography and ultrafiltration are preferable. In the case of using filtration methods, the abrasive grains comprised in the polishing liquid can be made to pass through a filter by setting appropriate conditions. In the case of including a compound having a weight-average molecular weight of several tens of thousands or less (for example, less than 50000), there are chromatography methods, filtration methods, distillation methods and the like, and gel permeation chromatography, ultrafiltration, and distillation under reduced pressure are preferable. In the case of including other kinds of abrasive grains, there are filtration methods, centrifugation methods and the like, and much abrasive grains including the hydroxide of a tetravalent metal element are comprised in a filtrate in the case of filtration and in a liquid phase in the case of centrifugation.

As a method for separating the abrasive grains by chromatography methods, for example, the abrasive grain component can be fractionated and/or other components can be fractionated by the following conditions.

sample solution: polishing liquid 100 µL
    detector: UV-VIS Detector manufactured by Hitachi, Ltd., product name "L-4200", wavelength: 400 nm
    integrator: GPC Integrator manufactured by Hitachi, Ltd., product name "D-2500"
    pump: manufactured by Hitachi, Ltd., product name "L-7100"
    column: packing column for water-based HPLC manufactured by Hitachi Chemical Co., Ltd., product name "GL-W550S"
    eluent: deionized water
    measurement temperature: 23° C.
    flow rate: 1 mL/min (pressure is about 40 to 50 kg/cm$^2$)
    measurement time: 60 min It is to be noted that deaeration treatment of an eluent is preferably performed using a deaerator before performing chromatography. In the case where a deaerator cannot be used, an eluent is preferably deaeration-treated in advance with ultrasonic wave or the like.

The abrasive grain component may not be able to be fractionated under the above-described conditions depending on components comprised in the polishing liquid, and in this case, it can be separated by optimizing the amount of a sample solution, the kind of a column, the kind of an eluent, a measurement temperature, a flow rate and the like. Moreover, by adjusting the pH of the polishing liquid, distillation time of the components comprised in the polishing liquid is adjusted, and it may be separated from the abrasive grains. In the case where the polishing liquid comprises insoluble components, the insoluble components are preferably removed by filtration, centrifugation or the like, as necessary.

[Preparation Method of Abrasive Grains]

The hydroxide of a tetravalent metal element can be prepared by reacting a salt of a tetravalent metal element (metal salt) with an alkali source (base). This makes it possible to obtain particles having an extremely fine particle diameter, and obtain a polishing liquid which further excels in a polishing scratch reducing effect. Such a method is disclosed in Patent Literature 3, for example. The hydroxide of a tetravalent metal element can be obtained by mixing a salt of a tetravalent metal element with an alkali liquid (solution of alkali source, for example, alkali aqueous solution). Moreover, the hydroxide of a tetravalent metal element can be obtained by mixing a metal salt solution comprising a salt of a tetravalent metal element (for example, metal salt aqueous solution) with an alkali liquid. It is to be noted that, in the case where at least one of the salt of a tetravalent metal element and the alkali source is supplied to a reaction system in a liquid state, a means for stirring a mixed liquid is not limited, and examples thereof include a method of stirring the mixed liquid using a rod-like, plate-like or propeller-like stirrer, or stirring blade, which rotates around a rotation axis; a method of stirring the mixed liquid by rotating a stirrer using a magnetic stirrer which transmits power from the outside of a container with a rotating magnetic field; a method of stirring the mixed liquid with a pump placed on the outside of a tank; and a method of stirring the mixed liquid by pressurizing outside air and furiously blowing it into a tank. Examples of the salt of a tetravalent metal element include $M(NO_3)_4$, $M(SO_4)_2$, $M(NH_4)_2(NO_3)_6$ and $M(NH_4)_4(SO_4)_4$, in which a metal is indicated by M.

Examples of a means for adjusting the absorbance and the light transmittance include optimization of the manufacturing method of the hydroxide of a tetravalent metal element. Examples of a method for altering the absorbance for light having a wavelength of 400 nm and the absorbance for light having a wavelength of 290 nm include selection of the alkali source in the alkali liquid, adjustment of the raw material concentrations in the metal salt solution and the alkali liquid, adjustment of the mixing rate of the metal salt solution and the alkali liquid, and adjustment of the liquid temperature of the mixed liquid obtained by mixing the salt of a tetravalent metal element with the alkali source. Examples of a method for altering the light transmittance for light having a wavelength of 500 nm include adjustment of the raw material concentrations in the metal salt solution and the alkali liquid, adjustment of the mixing rate of the metal salt solution and the alkali liquid, adjustment of the stirring rate when mixing, and adjustment of the liquid temperature of the mixed liquid.

In order to increase the absorbance for light having a wavelength of 400 nm, the absorbance for light having a wavelength of 290 nm, and the light transmittance for light having a wavelength of 500 nm, the manufacturing method of the hydroxide of a tetravalent metal element is preferably more "moderate". The term "moderate" means that an increase in pH is moderated (slowed) when the pH in the reaction system is increased as the reaction proceeds. Conversely, in order to decrease the absorbance for light having a wavelength of 400 nm, the absorbance for light having a wavelength of 290 nm, and the light transmittance for light having a wavelength of 500 nm, the manufacturing method of the hydroxide of a tetravalent metal element is preferably more "intensive". The term "intensive" means that an increase in pH is intensified (quickened) when the pH in the reaction system is increased as the reaction proceeds. In order for the values of the absorbance and the light transmittance to be in predetermined ranges, the manufacturing method of the hydroxide of a tetravalent metal element is preferably optimized by reference to the above-described tendency. Hereinafter, a controlling method of the absorbance and the light transmittance will be described in more detail.

{Alkali Source}

The alkali source of the alkali liquid is not particularly limited, but examples thereof include organic bases and inorganic bases. Examples of the organic bases include nitrogen-containing organic bases such as guanidine, triethylamine, and chitosan; nitrogen-containing heterocyclic organic bases such as pyridine, piperidine, pyrrolidine, and imidazole; and ammonium salts such as ammonium carbonate, ammonium hydrogen carbonate, tetramethylammonium hydroxide, tetraethylammonium hydroxide, tetramethylammonium chloride, and tetraethylammonium chloride. Examples of the inorganic bases include ammonia, and inorganic salts of alkali metal, such as lithium hydroxide, sodium hydroxide, potassium hydroxide, calcium hydroxide, lithium carbonate, sodium carbonate, potassium carbonate, lithium hydrogen carbonate, sodium hydrogen carbonate, and potassium hydrogen carbonate. The alkali sources can be used singly or in combinations of two or more.

In order to increase the absorbance for light having a wavelength of 400 nm and the absorbance for light having a wavelength of 290 nm, as the alkali source, an alkali source which exhibits weak basicity is preferably used. Among the alkali sources, nitrogen-containing heterocyclic organic bases are preferable, pyridine, piperidine, pyrrolidine and imidazole are more preferable, pyridine and imidazole are further preferable, and imidazole is particularly preferable.

{Concentration}

By controlling the raw material concentrations in the metal salt solution and the alkali liquid, the absorbance for light having a wavelength of 400 nm, the absorbance for light having a wavelength of 290 nm, and the light transmittance for light having a wavelength of 500 nm can be altered. Specifically, the absorbance tends to be increased by increasing the metal salt concentration of the metal salt solution, and the absorbance tends to be increased by decreasing the alkali concentration of the alkali liquid (concentration of base, concentration of alkali source). The light transmittance tends to be increased by increasing the metal salt concentration, and the light transmittance tends to be increased by decreasing the alkali concentration.

From the viewpoint of achieving both an excellent polishing rate and excellent stability of the abrasive grains, the upper limit of the metal salt concentration in the metal salt solution is preferably 1.000 mol/L or less, more preferably 0.500 mol/L or less, further preferably 0.300 mol/L or less, and particularly preferably 0.200 mol/L or less, based on the total of the metal salt solution. From the viewpoint of capable of suppressing rapid occurrence of a reaction (capable of moderating increase in pH) and increasing the absorbance for light having a wavelength of 400 nm, the absorbance for light having a wavelength of 290 nm, and the light transmittance for light having a wavelength of 500 nm, the lower limit of the metal salt concentration is preferably 0.010 mol/L or more, more preferably 0.020 mol/L or more, and further preferably 0.030 mol/L or more, based on the total of the metal salt solution.

From the viewpoint of suppressing rapid occurrence of a reaction, the upper limit of the alkali concentration in the alkali liquid is preferably 15.0 mol/L or less, more preferably 12.0 mol/L or less, further preferably 10.0 mol/L or less, and particularly preferably 5.0 mol/L or less, based on the total of the alkali liquid. The lower limit of the alkali concentration is not particularly limited, but from the viewpoint of productivity, it is preferably 0.001 mol/L or more based on the total of the alkali liquid.

It is preferable that the alkali concentration in the alkali liquid be adjusted as appropriate depending on the alkali source selected. For example, in the case of an alkali source having pKa of conjugate acid of the alkali source of 20 or more, from the viewpoint of suppressing rapid occurrence of a reaction, the upper limit of the alkali concentration is preferably 0.10 mol/L or less, more preferably 0.05 mol/L or less, and further preferably 0.01 mol/L or less, based on the total of the alkali liquid. The lower limit of the alkali concentration is not particularly limited, but from the viewpoint of suppressing the amount used of a solution used for obtaining a predetermined amount of the hydroxide of a tetravalent metal element, it is preferably 0.001 mol/L or more based on the total of the alkali liquid.

In the case of an alkali source having pKa of conjugate acid of the alkali source of 12 or more and less than 20, from the viewpoint of suppressing rapid occurrence of a reaction, the upper limit of the alkali concentration is preferably 1.0 mol/L or less, more preferably 0.50 mol/L or less, and further preferably 0.10 mol/L or less, based on the total of the alkali liquid. The lower limit of the alkali concentration is not particularly limited, but from the viewpoint of suppressing the amount used of a solution used for obtaining a predetermined amount of the hydroxide of a tetravalent metal element, it is preferably 0.01 mol/L or more based on the total of the alkali liquid.

In the case of an alkali source having pKa of conjugate acid of the alkali source of less than 12, from the viewpoint of suppressing rapid occurrence of a reaction, the upper limit of the alkali concentration is preferably 15.0 mol/L or less, more preferably 10.0 mol/L or less, and further preferably 5.0 mol/L or less, based on the total of the alkali liquid. The lower limit of the alkali concentration is not particularly limited, but from the viewpoint of suppressing the amount used of a solution used for obtaining a predetermined amount of the hydroxide of a tetravalent metal element, it is preferably 0.10 mol/L or more based on the total of the alkali liquid.

Regarding specific alkali sources, examples of the alkali source having pKa of conjugate acid of the alkali source of 20 or more include 1,8-diazabicyclo[5.4.0]undec-7-ene (pKa: 25). Examples of the alkali source having pKa of conjugate acid of the alkali source of 12 or more and less than 20 include potassium hydroxide (pKa: 16) and sodium hydroxide (pKa: 13). Examples of the alkali source having pKa of conjugate acid of the alkali source of less than 12 include ammonia (pKa: 9) and imidazole (pKa: 7). The pKa value of conjugate acid of the alkali source used is not particularly limited as long as the alkali concentration is appropriately adjusted, but pKa of conjugate acid of the alkali source is preferably less than 20, more preferably less than 12, further preferably less than 10, and particularly preferably less than 8.

{Mixing Rate}

By controlling the mixing rate of the metal salt solution and the alkali liquid, the absorbance for light having a wavelength of 400 nm, the absorbance for light having a wavelength of 290 nm, and the light transmittance for light having a wavelength of 500 nm can be altered. The absorbance and the light transmittance tend to be increased respectively by making an increase in pH be moderated (slowed). More specifically, the absorbance tends to be increased by slowing the mixing rate, and the absorbance tends to be decreased by quickening the mixing rate. The light transmittance for light having a wavelength of 500 nm tends to be increased by slowing the mixing rate, and the light transmittance tends to be decreased by quickening the mixing rate.

From the viewpoint of further suppressing rapid progression of a reaction and further suppressing bias of a reaction in a limited part, the upper limit of the mixing rate is preferably $5.00 \times 10^{-3}$ m$^3$/min (5 L/min) or less, more preferably $1.00 \times 10^{-3}$ m$^3$/min (1 L/min) or less, further preferably $5.00 \times 10^{-4}$ m$^3$/min (500 mL/min) or less, and particularly preferably $1.00 \times 10^{-4}$ m$^3$/min (100 mL/min) or less. The lower limit of the mixing rate is not particularly limited, but from the viewpoint of productivity, it is preferably $1.00 \times 10^{-7}$ m$^3$/min (0.1 mL/min) or more.

{Stirring Rate}

By controlling the stirring rate when mixing the metal salt solution and the alkali liquid, the light transmittance for light having a wavelength of 500 nm can be altered. Specifically, the light transmittance tends to be increased by quickening the stirring rate, and the light transmittance tends to be decreased by slowing the stirring rate.

From the viewpoint of further suppressing bias of a reaction in a limited part and excelling in mixing efficiency, the lower limit of the stirring rate is preferably 30 min$^{-1}$ or more, more preferably 50 min$^{-1}$ or more, and further preferably 80 min$^{-1}$ or more. The upper limit of the stirring rate is not particularly limited, and furthermore, it needs to be adjusted as appropriate depending on the size and the shape of the stirring blade, but from the viewpoint of suppressing splash of a liquid, it is preferably 1000 min$^{-1}$ or less.

{Liquid Temperature (Synthesis Temperature)}

By controlling the liquid temperature of the mixed liquid obtained by mixing the salt of a tetravalent metal element with the alkali source, the absorbance for light having a wavelength of 400 nm, the absorbance for light having a wavelength of 290 nm, and the light transmittance for light having a wavelength of 500 nm can be altered, and abrasive grains capable of achieving an intended polishing rate and storage stability can be obtained. Specifically, the absorbance tends to be increased by lowering the liquid temperature, and the absorbance tends to be decreased by raising the liquid temperature. The light transmittance tends to be increased by lowering the liquid temperature, and the light transmittance tends to be decreased by raising the liquid temperature.

The liquid temperature is, for example, a temperature in the mixed liquid, which can be read with a thermometer placed in the mixed liquid, and is preferably 30 to 100° C. From the viewpoint of capable of suppressing a rapid reaction, the upper limit of the liquid temperature is preferably 100° C. or less, more preferably 60° C. or less, further preferably 55° C. or less, particularly preferably 50° C. or less, and extremely preferably 45° C. or less. From the viewpoint of making a reaction easily proceed and capable of obtaining a polishing liquid which excels in storage stability (especially, which excels in stability of a polishing rate), the lower limit of the liquid temperature is preferably 30° C. or more, and more preferably 35° C. or more.

The hydroxide of a tetravalent metal element prepared as described above sometimes includes impurities, and the impurities may be removed. A method for removing the impurities is not particularly limited, and examples thereof include methods such as centrifugation, filter press and ultrafiltration. This makes it possible to adjust the absorbance for light having a wavelength of 450 to 600 nm.

(Additive)

The polishing liquid of the present embodiment can obtain an especially excellent polishing rate for an insulating material (for example, silicon oxide), and thus, is especially suitable for use in polishing a base substrate having an insulating material. According to the polishing liquid of the present embodiment, by selecting an additive as appropriate, both a polishing rate and polishing properties other than the polishing rate can be achieved at a high level.

As the additive, for example, known additives such as a dispersing agent which increases dispersibility of the abrasive grains, a polishing rate improver which improves the polishing rate, a flattening agent (a flattening agent which reduces irregularities on a surface to be polished after polishing, a global flattening agent which improves global flatness of a base substrate after polishing), and a selection ratio improver which improves a polishing selection ratio of an insulating material with respect to a stopper material such as silicon nitride or polysilicon can be used without particular limitation.

Examples of the dispersing agent include vinyl alcohol polymers and derivatives thereof, betaine, lauryl betaine, and lauryl dimethylamine oxide. Examples of the polishing rate improver include β-alanine betaine and stearyl betaine. Examples of the flattening agent which reduces irregularities on a surface to be polished include ammonium lauryl sulfate and triethanolamine polyoxyethylene alkyl ether sulfate. Examples of the global flattening agent include polyvinylpyrrolidone and polyacrolein. Examples of the selection ratio improver include polyethyleneimine, polyallylamine, and chitosan. These can be used singly or in combinations of two or more.

The polishing liquid of the present embodiment preferably comprises at least one selected from the group consisting of vinyl alcohol polymers and derivatives thereof as the additive. In this case, the additive covers the surface of the abrasive grains, and thus, adhesion of the abrasive grains to the surface to be polished is suppressed, and therefore, dispersibility of the abrasive grains is improved and stability of the abrasive grains can be further improved. Moreover, washability of the surface to be polished can also be improved. However, generally, vinyl alcohol which is a monomer of polyvinyl alcohol tends not to exist alone as a stable compound. Therefore, polyvinyl alcohol is generally obtained by polymerizing a vinyl carboxylate monomer such as a vinyl acetate monomer to obtain poly(vinyl carboxylate) and saponifying (hydrolyzing) this. Therefore, for example, a vinyl alcohol polymer obtained using a vinyl acetate monomer as a raw material includes —OCOCH$_3$ and hydrolyzed —OH as functional groups in the molecule, and the ratio of —OH is defined as a saponification degree. That is, a vinyl alcohol polymer whose saponification degree is not 100% has a structure which is essentially a copolymer of vinyl acetate and vinyl alcohol. Moreover, a vinyl alcohol polymer may be one obtained by copolymerizing a vinyl carboxylate monomer such as a vinyl acetate monomer and other vinyl group-containing monomer (for example, ethylene, propylene, styrene, and vinyl chloride) and saponifying all or a part of portions derived from the vinyl carboxylate monomer. In the present description, all of these are correctively referred to as "vinyl alcohol polymers", and a "vinyl alcohol polymer" is ideally a polymer having the following structural formula.

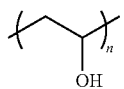

[Chemical Formula 1]

(wherein n represents a positive integer)

A "derivative" of a vinyl alcohol polymer is defined to include a derivative of a homopolymer of vinyl alcohol (that is, polymer having a saponification degree of 100%) and derivatives of copolymers of a vinyl alcohol monomer and other vinyl group-containing monomers (for example, ethylene, propylene, styrene, vinyl chloride).

Examples of the derivative of a vinyl alcohol polymer include polymers in which a part of hydroxyl groups is substituted by amino groups, carboxyl groups, ester groups or the like, and polymers in which a part of hydroxyl groups is modified. Examples of such a derivative include reactive polyvinyl alcohols (for example, GOHSEFIMER (registered trademark) Z manufactured by Nippon Synthetic Chemical Industry Co., Ltd.), cationized polyvinyl alcohols (for example, GOHSEFIMER (registered trademark) K manufactured by Nippon Synthetic Chemical Industry Co., Ltd.), anionized polyvinyl alcohols (for example, GOHSERAN (registered trademark) L and GOHSENOL (registered trademark) T manufactured by Nippon Synthetic Chemical Industry Co., Ltd.), and hydrophilic group-modified polyvinyl alcohols (for example, ECOMATI manufactured by Nippon Synthetic Chemical Industry Co., Ltd.).

As described above, a vinyl alcohol polymer and a derivative thereof function as a dispersing agent of the abrasive grains, and have an effect of further improving stability of the polishing liquid. It is thought that interaction between hydroxyl groups of the vinyl alcohol polymer and a derivative thereof and the abrasive grains including the hydroxide of a tetravalent metal element suppresses aggregation of the abrasive grains and suppresses a change in the particle diameter of the abrasive grains in the polishing liquid, and thus, stability can be further improved.

By using the vinyl alcohol polymer and a derivative thereof in combination with the abrasive grains including the hydroxide of a tetravalent metal element, the polishing selection ratio of an insulating material (for example, silicon oxide) with respect to a stopper material (for example, silicon nitride, polysilicon), (polishing rate of insulating material/polishing rate of stopper material), can also be increased. Moreover, the vinyl alcohol polymer and a derivative thereof can improve flatness of a surface to be polished after polishing, and can also prevent adhesion of the abrasive grains to the surface to be polished (improvement in washability).

From the viewpoint of further increasing a polishing selection ratio of an insulating material with respect to a stopper material, the saponification degree of the vinyl alcohol polymer and a derivative thereof is preferably 95 mol % or less. From the same viewpoint, the upper limit of the saponification degree is more preferably 90 mol % or less, further preferably 88 mol % or less, particularly preferably 85 mol % or less, extremely preferably 83 mol % or less, and very preferably 80 mol % or less.

The lower limit of the saponification degree is not particularly limited, but from the viewpoint of excelling in solubility in water, it is preferably 50 mol % or more, more preferably 60 mol % or more, and further preferably 70 mol % or more. It is to be noted that the saponification degree of the vinyl alcohol polymer and a derivative thereof can be measured in conformity with JIS K 6726 (Testing methods for polyvinyl alcohol).

The upper limit of the average degree of polymerization (weight-average molecular weight) of the vinyl alcohol polymer and a derivative thereof is not particularly limited, but from the viewpoint of further suppressing a reduction in the polishing rate of a material to be polished, it is preferably 3000 or less, more preferably 2000 or less, and further preferably 1000 or less.

From the viewpoint of further increasing a polishing selection ratio of an insulating material with respect to a stopper material, the lower limit of the average degree of polymerization is preferably 50 or more, more preferably 100 or more, and further preferably 150 or more. It is to be noted that the average degree of polymerization of the vinyl alcohol polymer and a derivative thereof can be measured in conformity with JIS K 6726 (Testing methods for polyvinyl alcohol).

For the purpose of adjusting a polishing selection ratio of an insulating material with respect to a stopper material and flatness of a base substrate after polishing, multiple polymers having different saponification degrees, average degrees of polymerization or the like may be used in combination as the vinyl alcohol polymer and a derivative thereof. In this case, the saponification degree of at least one vinyl alcohol polymer and a derivative thereof is preferably 95 mol % or less, and from the viewpoint of further improving a polishing selection ratio, the average saponification degree calculated from each saponification degree and the mixing ratio is more preferably 95 mol % or less. The preferred range of these saponification degrees is the same as the above-described range.

From the viewpoint of more effectively obtaining effects of an additive, the content of the additive is preferably 0.01 mass % or more, more preferably 0.05 mass % or more, further preferably 0.08 mass % or more, and particularly preferably 0.1 mass % or more, based on the total mass of the polishing liquid. From the viewpoint of further suppressing a reduction in the polishing rate of a material to be polished, the content of the additive is preferably 10 mass % or less, more preferably 5.0 mass % or less, further preferably 3.0 mass % or less, and particularly preferably 1.0 mass % or less, based on the total mass of the polishing liquid.

(Water)

Water in the polishing liquid of the present embodiment is not particularly limited, but deionized water, ultrapure water or the like is preferable. The content of water may be the remainder of the polishing liquid excluding the contents of other constituent components, and is not particularly limited.

A method for dispersing the abrasive grains into water is not particularly limited, and specific examples thereof include a dispersing method by stirring; and a dispersing method with a homogenizer, an ultrasonic disperser, a wet ball mill or the like.

[Properties of Polishing Liquid]

The pH (25° C.) of the polishing liquid is preferably 2.0 to 9.0 from the viewpoint of obtaining a further excellent polishing rate. It is thought that this is because the surface potential of the abrasive grains with respect to the surface potential of a surface to be polished becomes favorable, and the abrasive grains become easy to act on the surface to be polished. From the viewpoint of stabilizing the pH of the polishing liquid and making it difficult for problems such as aggregation of the abrasive grains to occur, the lower limit of the pH is preferably 2.0 or more, more preferably 3.0 or more, and further preferably 4.0 or more. From the viewpoint of excelling in dispersibility of the abrasive grains and obtaining a further excellent polishing rate, the upper limit of the pH is preferably 9.0 or less, more preferably 8.0 or less, and further preferably 7.5 or less.

The pH of the polishing liquid can be measured with a pH meter (for example, model number PH81 manufactured by Yokogawa Electric Corporation). As the pH, for example, after two-point calibration using a standard buffer (phthalate pH buffer: pH 4.01 (25° C.) and a neutral phosphate pH buffer: pH 6.86 (25° C.)), an electrode is placed in the polishing liquid, and a value stabilized after a lapse of 2 minutes or more is used.

In order to adjust the pH of the polishing liquid, a conventionally-known pH adjuster can be used without particular limitation. Specific examples of the pH adjuster include inorganic acids such as phosphoric acid, sulfuric acid, and nitric acid; organic acids such as carboxylic acids such as formic acid, acetic acid, propionic acid, maleic acid, phthalic acid, citric acid, succinic acid, malonic acid, glutaric acid, adipic acid, fumaric acid, lactic acid, and benzoic acid; amines such as ethylenediamine, toluidine, piperazine, histidine, aniline, 2-aminopyridine, 3-aminopyridine, picoline acid, morpholine, piperidine, and hydroxylamine; and nitrogen-containing heterocyclic compounds such as pyridine, imidazole, triazole, pyrazole, benzimidazole, and benzotriazole. It is to be noted that the pH adjuster may be comprised in a slurry (including slurry precursor, storage liquid for slurry and the like), an additive liquid and the like described below.

A pH stabilizer means an additive for adjustment to a predetermined pH, and it is preferably a buffer component. The buffer component is preferably a compound having pKa within a range of ±1.5, and more preferably a compound having pKa within a range of ±1.0, with respect to the predetermined pH. Examples of such a compound include amino acids such as glycine, arginine, lysine, asparagine, aspartic acid, and glutamic acid; mixtures of the above-described carboxylic acids and bases; and salts of the above-described carboxylic acids.

<Slurry>

The slurry of the present embodiment may be used directly for polishing, or may be used as a slurry of a so-called two-pack type polishing liquid, in which the constituent components of the polishing liquid are separated into a slurry and an additive liquid. In the present embodiment, the polishing liquid and the slurry differ in the presence or absence of an additive, and the polishing liquid is obtained by adding the additive to the slurry.

The slurry of the present embodiment comprises at least the same abrasive grains as the polishing liquid of the present embodiment, and water. For example, the abrasive grains are characterized by including the hydroxide of a tetravalent metal element, and a preferred range and a measuring method of the average secondary particle diameter of the abrasive grains are the same as the abrasive grains used in the polishing liquid of the present embodiment.

In the slurry of the present embodiment, the abrasive grains produce absorbance of 1.00 or more and less than 1.50 for light having a wavelength of 400 nm in an aqueous dispersion having a content of the abrasive grains adjusted to 1.0 mass %. The abrasive grains preferably produce absorbance of 1.000 or more for light having a wavelength of 290 nm in an aqueous dispersion having a content of the abrasive grains adjusted to 0.0065 mass %. The abrasive grains preferably produce absorbance of 0.010 or less for light having a wavelength of 450 to 600 nm in an aqueous dispersion having a content of the abrasive grains adjusted to 0.0065 mass %. The abrasive grains preferably produce light transmittance of 50%/cm or more for light having a wavelength of 500 nm in an aqueous dispersion having a content of the abrasive grains adjusted to 1.0 mass %. Preferred ranges and measuring methods of these absorbance and light transmittance are the same as the abrasive grains used in the polishing liquid of the present embodiment.

In the constituent components of the slurry of the present embodiment, the hydroxide of a tetravalent metal element is thought to have a significant impact on polishing properties. Thus, by adjusting the content of the hydroxide of a tetravalent metal element, a chemical interaction between the abrasive grains and a surface to be polished is improved, and the polishing rate can be further improved. Specifically, the content of the hydroxide of a tetravalent metal element is preferably 0.01 mass % or more, more preferably 0.03 mass % or more, and further preferably 0.05 mass % or more, based on the total mass of the slurry, from the viewpoint of making it easier to sufficiently exhibit the function of the hydroxide of a tetravalent metal element. The content of the hydroxide of a tetravalent metal element is preferably 8 mass % or less, more preferably 5 mass % or less, further preferably 3 mass % or less, particularly preferably 1 mass % or less, extremely preferably 0.7 mass % or less, and very preferably 0.5 mass % or less, based on the total mass of the slurry, from the viewpoint of making it easier to avoid aggregation of the abrasive grains, and from the viewpoint of obtaining a favorable chemical interaction with the surface to be polished, and capable of effectively using properties of the abrasive grains (for example, polishing rate improving action).

In the slurry of the present embodiment, the lower limit of the content of the abrasive grains is preferably 0.01 mass % or more, more preferably 0.03 mass % or more, and further preferably 0.05 mass % or more, based on the total mass of the slurry, from the viewpoint of making it easier to obtain an intended polishing rate. The upper limit of the content of the abrasive grains is not particularly limited, but from the viewpoint of making it easier to avoid aggregation of the abrasive grains, it is preferably 10 mass % or less, more preferably 5 mass % or less, further preferably 3 mass % or less, particularly preferably 1 mass % or less, extremely preferably 0.7 mass % or less, and very preferably 0.5 mass % or less, based on the total mass of the slurry.

The pH (25° C.) of the slurry of the present embodiment is preferably 2.0 to 9.0 from the viewpoint of obtaining a further excellent polishing rate because the surface potential of the abrasive grains with respect to the surface potential of a surface to be polished becomes favorable, and the abrasive grains become easy to act on the surface to be polished. From the viewpoint of stabilizing the pH of the slurry and making it difficult for problems such as aggregation of the abrasive grains to occur, the lower limit of the pH is preferably 2.0 or more, more preferably 2.2 or more, and further preferably 2.5 or more. From the viewpoint of excelling in dispersibility of the abrasive grains and obtaining a further excellent polishing rate, the upper limit of the pH is preferably 9.0 or less, more preferably 8.0 or less, further preferably 7.0 or less, particularly preferably 6.5 or less, and extremely preferably 6.0 or less. The pH of the slurry can be measured by the same method as the pH of the polishing liquid of the present embodiment.

<Polishing-Liquid Set>

In the polishing-liquid set of the present embodiment, the constituent components of the polishing liquid are separately stored as a slurry and an additive liquid such that the slurry (first liquid) and the additive liquid (second liquid) are mixed to form the polishing liquid. As the slurry, the slurry of the present embodiment can be used. As the additive liquid, a liquid in which the additive is dissolved in water (liquid comprising additive and water) can be used. The polishing-liquid set is used as a polishing liquid by mixing the slurry and the additive liquid when polishing. By separately storing the constituent components of the polishing liquid into at least two liquids in this manner, a polishing liquid which further excels in storage stability can be obtained. It is to be noted that, in the polishing-liquid set of the present embodiment, the constituent components may be separated into three liquids or more.

As the additive comprised in the additive liquid, the same additive as one described for the above-described polishing liquid can be used. From the viewpoint of suppressing an excessive reduction in the polishing rate when the additive liquid and the slurry are mixed to prepare the polishing liquid, the content of the additive in the additive liquid is preferably 0.01 mass % or more, and more preferably 0.02 mass % or more, based on the total mass of the additive liquid. From the viewpoint of suppressing an excessive reduction in the polishing rate when the additive liquid and the slurry are mixed to prepare the polishing liquid, the content of the additive in the additive liquid is preferably 20 mass % or less based on the total mass of the additive liquid.

Water in the additive liquid is not particularly limited, but deionized water, ultrapure water or the like is preferable. The content of water may be the remainder excluding the contents of other constituent components, and is not particularly limited.

<Base Substrate Polishing Method and Base Substrate>

A base substrate polishing method using the above-described polishing liquid, slurry or polishing-liquid set, and a base substrate obtained thereby will be described. The polishing method of the present embodiment is a polishing method using a one-pack type polishing liquid in the case of using the above-described polishing liquid or slurry, and is a polishing method using a two-pack type polishing liquid or a three-pack or more type polishing liquid in the case of using the above-described polishing-liquid set.

In the base substrate polishing method of the present embodiment, a base substrate having a material to be polished on the surface (for example, substrate such as semiconductor substrate) is polished. In the base substrate polishing method of the present embodiment, the material to be polished may be polished using a stopper formed under the material to be polished. The base substrate polishing method of the present embodiment comprises at least a preparing step, a base substrate arranging step and a polishing step, for example. In the preparing step, a base substrate having a material to be polished on the surface is prepared. In the base substrate arranging step, the base substrate is arranged such that the material to be polished is arranged to be opposed to a polishing pad. In the polishing step, at least a part of the material to be polished is removed by using the polishing liquid, slurry or polishing-liquid set. The shape of the material to be polished, which is subjected to be polished, is not particularly limited, and it is a film shape (material film to be polished), for example.

Examples of the material to be polished include inorganic insulating materials such as silicon oxide; organic insulating materials such as organosilicate glass and a wholly aromatic ring based Low-k material; and stopper materials such as silicon nitride and polysilicon, and among them, inorganic insulating materials and organic insulating materials are preferable, and inorganic insulating materials are more preferable. A silicon oxide film can be obtained by a low-pressure CVD method, a plasma CVD method or the like. The silicon oxide film may be doped with an element such as phosphorus and boron. Irregularities are preferably formed on the surface of the material to be polished (surface to be polished). In the base substrate polishing method of the present embodiment, convex parts of the irregularities of the material to be polished are preferentially polished, and a base substrate having a flattened surface can be obtained.

In the case where the one-pack type polishing liquid or slurry is used, in the polishing step, the polishing liquid or slurry is supplied between the material to be polished of the base substrate and the polishing pad of a polishing platen, and at least a part of the material to be polished is polished. For example, the polishing liquid or slurry is supplied between the polishing pad and the material to be polished with the material to be polished pressed against the polishing pad, and at least a part of the material to be polished is polished by relatively moving the base substrate and the polishing platen. At this time, the polishing liquid and slurry may be directly supplied onto the polishing pad as a composition having an intended water amount.

From the viewpoint of reducing cost for preservation, transport, storage and the like, the polishing liquid and slurry of the present embodiment can be stored as a storage liquid for a polishing liquid or a storage liquid for a slurry, which is used by diluting liquid components 2-fold or more (based on mass), for example, with a fluid medium such as water. The above-described each storage liquid may be diluted with the fluid medium immediately before polishing, or the storage liquid and the fluid medium are supplied onto the polishing pad and diluted on the polishing pad.

The lower limit of the dilution ratio (based on mass) of the storage liquid is preferably 2-fold or more, more preferably 3-fold or more, further preferably 5-fold or more, and particularly preferably 10-fold or more because a higher ratio results in a higher reducing effect of cost for preservation, transport, storage and the like. The upper limit of the dilution ratio is not particularly limited, but a higher ratio results in a greater amount (higher concentration) of components comprised in the storage liquid and stability during storage tends to be decreased, and thus, it is preferably 500-fold or less, more preferably 200-fold or less, further preferably 100-fold or less, and particularly preferably 50-fold or less. It is to be noted that the same is applied for a polishing liquid in which the constituent components are separated into three liquids or more.

In the above-described storage liquid, the content of the abrasive grains is not particularly limited, but from the viewpoint of making it easier to avoid aggregation of the abrasive grains, it is preferably 20 mass % or less, more preferably 15 mass % or less, further preferably 10 mass % or less, and particularly preferably 5 mass % or less, based on the total mass of the storage liquid. From the viewpoint of reducing cost for preservation, transport, storage and the like, the content of the abrasive grains is preferably 0.02 mass % or more, more preferably 0.1 mass % or more, further preferably 0.5 mass % or more, and particularly preferably 1 mass % or more, based on the total mass of the storage liquid.

In the case where the two-pack type polishing liquid is used, the base substrate polishing method of the present embodiment may comprise a polishing liquid preparing step in which the slurry and the additive liquid are mixed before the polishing step to obtain a polishing liquid. In this case, in the polishing step, the material to be polished is polished using the polishing liquid obtained in the polishing liquid preparing step. In the polishing liquid preparing step of the foregoing polishing method, the slurry and the additive liquid are solution-sent through separate pipes, and these pipes are merged just before the exit of a supply pipe to obtain the polishing liquid. The polishing liquid may be directly supplied onto the polishing pad as a polishing liquid having an intended water amount, or may be diluted on the polishing pad after being supplied onto the polishing pad as a storage liquid having a small water amount. It is to be noted that the same is applied for a polishing liquid in which the constituent components are separated into three liquids or more.

In the case where the two-pack type polishing liquid is used, in the polishing step, at least a part of the material to be polished may be polished by the polishing liquid obtained by supplying each of the slurry and the additive liquid between the polishing pad and the material to be polished to mix the slurry and the additive liquid. In the foregoing polishing method, the slurry and the additive liquid can be supplied onto the polishing pad through separate solution-sending systems. The slurry and/or the additive liquid may be directly supplied onto the polishing pad as a liquid having an intended water amount, or may be diluted on the polishing pad after being supplied onto the polishing pad as a storage liquid having a small water amount. It is to be noted that the same is applied for a polishing liquid in which the constituent components are separated into three liquids or more.

As a polishing device used in the polishing method of the present embodiment, for example, a common polishing device having a holder for holding a base substrate having a material to be polished, and a polishing platen fitted with a motor capable of changing a rotational frequency and the like, and capable of being fitted with a polishing pad, can be used. Examples of the polishing device include a polishing device (model number: EPO-111) manufactured by EBARA CORPORATION, and a polishing device (product name: Mirra3400, Reflexion Polishing Machine) manufactured by Applied Materials, Inc.

The polishing pad is not particularly limited, and for example, common non-woven fabric, foamed polyurethane, porous fluorine resin and the like can be used. The polishing pad subjected to groove processing such that the polishing liquid or the like accumulates therein is preferable.

The polishing conditions are not particularly limited, but from the viewpoint of suppressing flying-off of the base substrate, the rotational speed of the polishing platen is preferably a low rotation of 200 $min^{-1}$ (rpm) or less. The pressure (machining load) applied to the base substrate is preferably 100 kPa or less, from the viewpoint of further suppressing generation of polishing scratch. The polishing liquid, the slurry or the like is preferably continuously supplied to the surface of the polishing pad with a pump or the like during polishing. The amount supplied is not particularly limited, but the surface of the polishing pad is preferably covered with the polishing liquid, the slurry or the like at all times. It is preferable that the base substrate after the completion of polishing be washed well in running water, and then dried after removing water droplets adhering to the base substrate with a spin dryer or the like.

EXAMPLES

Hereinafter, the present invention will be described in detail with reference to Examples, but the present invention is not limited thereto.

(Preparation of Abrasive Grains Including Hydroxide of Tetravalent Metal Element)

Abrasive grains including a hydroxide of a tetravalent metal element were prepared in accordance with the following procedure. It is to be noted that the values represented by A to G in the explanation below are values shown in Table 1, respectively.

Examples 1 to 9

A [L] of water was charged in a container, and B [L] of cerium ammonium nitrate aqueous solution having a concentration of 50 mass % (formula $Ce(NH_4)_2(NO_3)_6$, formula weight 548.2 g/mol, manufactured by NIHON KAGAKU SANGYO CO., LTD., product name 50% CAN liquid) was added and mixed. After that, the liquid temperature was adjusted to C [° C.] to obtain a metal salt aqueous solution. The metal salt concentration of the metal salt aqueous solution was as shown in Table 1.

Next, an alkali species shown in Table 1 was dissolved in water to prepare E [L] of an aqueous solution having a concentration of D [mol/L], and then, the liquid temperature was adjusted to a temperature of C [° C.] to obtain an alkali liquid.

The container containing the above-described metal salt aqueous solution therein was placed in a water tank filled with water. The water temperature of the water tank was adjusted to the temperature represented by C [° C.] in Table 1 using an external-circulating device Coolnics Circulator (manufactured by Tokyo Rikakikai Co., Ltd. (EYELA), product name Cooling Thermopump CTP101). The above-described alkali liquid was added into the container at a mixing rate of G [$m^3$/min] while maintaining the water temperature at C [° C.] and stirring the metal salt aqueous solution at a stirring rate represented by F [$min^{-1}$] in Table 1, to obtain a slurry precursor 1 comprising abrasive grains including a hydroxide of tetravalent cerium. The pH of the slurry precursor 1 was as indicated by "final pH" in Table 1. It is to be noted that, in each Example, the metal salt aqueous solution was stirred using a 3-bladed pitched paddle having a total blade length of 5 cm.

The obtained slurry precursor 1 was subjected to ultrafiltration while being circulated, using a hollow fiber filter having a cutoff molecular weight of 50000, to remove ion components until the conductivity became 50 mS/m or less, and therefore, a slurry precursor 2 was obtained. It is to be noted that the above-described ultrafiltration was performed while adding water so as to maintain a constant water level of a tank containing the slurry precursor 1, using a fluid level sensor. The content of a non-volatile component (the content of the abrasive grains including a hydroxide of tetravalent cerium) of the slurry precursor 2 was calculated by taking a proper amount of the obtained slurry precursor 2 and measuring the mass before and after drying. It is to be noted that, if the content of the non-volatile component is less than 1.0 mass % at this stage, ultrafiltration was further performed such that it was concentrated to about more than 1.1 mass %.

Example 10

The slurry precursor 1 obtained by the same method as Example 3 was subjected to ultrafiltration while being circulated, using a hollow fiber filter having a cutoff molecular weight of 50000, to remove ion components until the conductivity became 50 mS/m or less, and then, 1.0 mass % imidazole aqueous solution was added until the pH became 5.0, and therefore, a slurry precursor 2 was obtained. The ultrafiltration and calculation of the content of the non-volatile component (the content of the abrasive grains including a hydroxide of tetravalent cerium) of the slurry precursor 2 were performed in the same manner as Examples 1 to 9.

Comparative Examples 1 to 4

A [L] of water was charged in a container, and B [L] of cerium ammonium nitrate aqueous solution having a concentration of 50 mass % (formula $Ce(NH_4)_2(NO_3)_6$, formula weight 548.2 g/mol, manufactured by NIHON KAGAKU SANGYO CO., LTD., product name 50% CAN liquid) was added and mixed. After that, the liquid temperature was adjusted to C [° C.] to obtain a metal salt aqueous solution. The metal salt concentration of the metal salt aqueous solution was as shown in Table 1.

Next, an alkali species shown in Table 1 was dissolved in water to prepare E [L] of an aqueous solution having a concentration of D [mol/L], and then, the liquid temperature was adjusted to a temperature of C [° C.] to obtain an alkali liquid.

The container containing the above-described metal salt aqueous solution therein was placed in a water tank filled with water. The water temperature of the water tank was adjusted to the temperature represented by C [° C.] in Table 1 using an external-circulating device Coolnics Circulator (manufactured by Tokyo Rikakikai Co., Ltd. (EYELA), product name Cooling Thermopump CTP101). The above-described alkali liquid was added into the container at a mixing rate of G [m³/min] while maintaining the water temperature at C [° C.] and stirring the metal salt aqueous solution at a stirring rate represented by F [min⁻¹] Table 1, to obtain a slurry precursor 1 comprising abrasive grains including a hydroxide of tetravalent cerium. The pH of the slurry precursor 1 was as indicated by "final pH" in Table 1. It is to be noted that, in each Comparative Example, the metal salt aqueous solution was stirred using a 3-bladed pitched paddle having a total blade length of 5 cm.

The slurry precursor 1 was centrifuged at 3000 G and subjected to solid-liquid separation by decantation to remove the liquid. Operation in which a proper amount of water is added to the obtained residue to be stirred well, and then, centrifugation and solid-liquid separation by decantation are performed, was further performed 3 times.

Water was again added to the obtained residue to adjust the liquid amount to 1.0 L, and then, ultrasonic dispersion treatment was performed for 180 minutes to obtain a slurry precursor 2. The content of a non-volatile component (the content of the abrasive grains including a hydroxide of tetravalent cerium) of the slurry precursor 2 was calculated by taking a proper amount of the obtained slurry precursor 2 and measuring the mass before and after drying.

TABLE 1

| | Metal Salt Solution | | | Alkali Liquid | | | Synthesis Conditions | | | |
| --- | --- | --- | --- | --- | --- | --- | --- | --- | --- | --- |
| | 50 mass % | | | | | | | | | |
| | Water Amount A [L] | Metal Salt Liquid Amount B [L] | Concentration [mol/L] | Alkali Species | Concentration D [mol/L] | Liquid Amount E [L] | Synthesis Temperature C [° C.] | Stirring Rate F [min⁻¹] | Mixing Rate G [m³/min] | Final pH |
| Example 1 | 4.968 | 0.143 | 0.037 | Imidazole | 0.7 | 0.912 | 50 | 400 | 0.0000017 | 2.5 |
| Example 2 | 4.968 | 0.143 | 0.037 | Imidazole | 0.7 | 0.912 | 40 | 400 | 0.0000017 | 2.4 |
| Example 3 | 7.603 | 0.715 | 0.114 | Imidazole | 0.7 | 4.566 | 40 | 400 | 0.0000085 | 2.2 |
| Example 4 | 7.592 | 0.714 | 0.114 | Imidazole | 0.7 | 4.560 | 30 | 500 | 0.0000051 | 3.0 |
| Example 5 | 3.796 | 0.357 | 0.114 | Imidazole | 0.7 | 2.280 | 50 | 500 | 0.0000063 | 2.5 |
| Example 6 | 4.141 | 0.119 | 0.037 | Imidazole | 0.7 | 0.760 | 40 | 400 | 0.0000014 | 2.6 |
| Example 7 | 3.796 | 0.357 | 0.114 | Imidazole | 1.5 | 1.140 | 40 | 400 | 0.0000032 | 2.2 |
| Example 8 | 3.035 | 0.286 | 0.114 | Imidazole | 0.7 | 1.824 | 45 | 400 | 0.0000034 | 2.2 |
| Example 9 | 3.035 | 0.286 | 0.114 | Imidazole | 0.7 | 1.824 | 35 | 400 | 0.0000034 | 2.4 |
| Example 10 | 7.603 | 0.715 | 0.114 | Imidazole | 0.7 | 4.566 | 40 | 400 | 0.0000085 | 2.2 |
| Comparative Example 1 | 1.656 | 0.048 | 0.037 | Imidazole | 1.5 | 0.152 | 20 | 400 | 0.0000100 | 5.2 |
| Comparative Example 2 | 1.656 | 0.048 | 0.037 | Ammonia | 8.8 | 0.026 | 20 | 400 | 0.0000013 | 5.2 |
| Comparative Example 3 | 1.656 | 0.048 | 0.037 | Ammonia | 14.7 | 0.016 | 20 | 400 | 0.0001560 | 5.2 |
| Comparative Example 4 | 1.656 | 0.048 | 0.037 | Imidazole | 1.5 | 0.157 | 25 | 500 | 0.0000100 | 5.2 |

(Structure Analysis of Abrasive Grains)

A proper amount of the slurry precursor 2 was taken and vacuum dried to isolate abrasive grains. With respect to a sample obtained by being washed well with pure water, measurement by the FT-IR ATR method was performed, and a peak based on a nitrate ion ($NO_3^-$) was observed in addition to a peak based on a hydroxide ion. Moreover, with respect to the same sample, measurement of XPS for nitrogen (N-XPS) was performed, and a peak based on $NH_4^+$ was not observed and a peak based on a nitrate ion was observed. According to these results, it was confirmed that the abrasive grains comprised in the slurry precursor 2 include at least a part of particles having a nitrate ion bonded to the cerium element. Moreover, since the abrasive grains include at least a part of particles having a hydroxide ion bonded to the cerium element, it was confirmed that the abrasive grains include a hydroxide of cerium. According to these results, it was confirmed that the hydroxide of cerium includes the hydroxide ion bonded to the cerium element.

(Measurement of Absorbance and Light Transmittance)

A proper amount of the slurry precursor 2 was taken and diluted with water such that the abrasive grain content is 0.0065 mass % (65 ppm) to obtain a measuring sample (aqueous dispersion). Approximately 4 mL of the measuring sample was poured into a 1-cm square cell, and the cell was placed in a spectrophotometer (device name: U3310) manufactured by Hitachi, Ltd. Absorbance measurement was performed within a range of a wavelength of 200 to 600 nm, and the absorbance for light having a wavelength of 290 nm and the absorbance for light having a wavelength of 450 to 600 nm were measured. The results are shown in Table 2.

A proper amount of the slurry precursor 2 was taken and diluted with water such that the abrasive grain content is 1.0 mass % to obtain a measuring sample (aqueous dispersion). Approximately 4 mL of the measuring sample was poured into a 1-cm square cell, and the cell was placed in a spectrophotometer (device name: U3310) manufactured by Hitachi, Ltd. Absorbance measurement was performed within a range of a wavelength of 200 to 600 nm, and the absorbance for light having a wavelength of 400 nm and the light transmittance for light having a wavelength of 500 nm were measured. The results are shown in Table 2.

(Measurement of Average Secondary Particle Diameter)

A proper amount of the slurry precursor 2 was taken and diluted with water such that the abrasive grain content is 0.2 mass % to obtain a measuring sample (aqueous dispersion). Approximately 4 mL of the measuring sample was poured into a 1-cm square cell, and the cell was placed in N5: device name, manufactured by Beckman Coulter, Inc. Measurement was performed at 25° C. with a refractive index and a viscosity of a dispersion medium adjusted to 1.33 and 0.887 mPa·s, and the indicated average particle diameter value was used as the average secondary particle diameter. The results are shown in Table 2.

TABLE 2

|  | Absorbance [290 nm] Abrasive Grain Content: 65 ppm | Absorbance [450-600 nm] | Absorbance [400 nm] Abrasive Grain Content: 1.0 mass % | Light Transmittance [500 nm] [%/cm] | Average Secondary Particle Diameter [nm] |
|---|---|---|---|---|---|
| Example 1 | 1.207 | <0.010 | 1.49 | >99 | 24 |
| Example 2 | 1.246 | <0.010 | 1.49 | >99 | 15 |
| Example 3 | 1.248 | <0.010 | 1.44 | >99 | 20 |
| Example 4 | 1.234 | <0.010 | 1.47 | >99 | 32 |
| Example 5 | 1.195 | <0.010 | 1.41 | >99 | 47 |
| Example 6 | 1.250 | <0.010 | 1.49 | >99 | 56 |
| Example 7 | 1.218 | <0.010 | 1.41 | >99 | 21 |
| Example 8 | 1.201 | <0.010 | 1.37 | >99 | 17 |
| Example 9 | 1.189 | <0.010 | 1.40 | 98 | 12 |
| Example 10 | 1.212 | <0.010 | 1.12 | >99 | 17 |
| Comparative Example 1 | 1.242 | <0.010 | 2.71 | >99 | 14 |
| Comparative Example 2 | 1.314 | <0.010 | 2.04 | 83 | 122 |
| Comparative Example 3 | 1.979 | <0.010 | >10 | 0.1 | 162 |
| Comparative Example 4 | 1.036 | <0.010 | 1.57 | >99 | 25 |

After retaining a measuring sample at 60° C. for 72 hours, which is the same as the measuring sample used for measurement of the absorbance and the light transmittance in Examples 1 to 10, absorbance and light transmittance were measured in the same manner. The absorbance for light having a wavelength of 400 nm was 1.00 or more and less than 1.50, the absorbance for light having a wavelength of 290 nm was 1.000 or more, the absorbance for light having a wavelength of 450 to 600 nm was 0.010 or less, and the light transmittance for light having a wavelength of 500 nm was 50%/cm or more.

(Appearance Evaluation of Storage Liquid for Slurry)

Water was added to the slurry precursor 2, and the abrasive grain content was adjusted to 1.0 mass % to obtain a storage liquid 1 for a slurry. Moreover, apart from the storage liquid 1 for a slurry, a storage liquid 2 for a slurry was prepared by storing the storage liquid 1 for a slurry at 60° C. for 72 hours. Observation results of appearances of the storage liquids 1 and 2 for a slurry are shown in Table 3.

(pH Measurement of Storage Liquid for Slurry)

The pHs (25° C.) of the storage liquid 1 for a slurry and the storage liquid 2 for a slurry were measured using model number PH81 manufactured by Yokogawa Electric Corporation. The results are shown in Table 3.

(Preparation of Slurry)

150 g of pure water was added to 100 g of each of the storage liquids 1 and 2 for a slurry to obtain slurries 1 and 2 having an abrasive grain content of 0.4 mass %.

(Preparation of Polishing Liquid)

An additive liquid 1 comprising 5 mass % polyvinyl alcohol as an additive and X mass % imidazole was prepared. 150 g of water was added to 100 g of the additive liquid 1 to obtain an additive liquid 2. The slurry 1 and the additive liquid 2 were mixed at 1:1 (mass ratio) to obtain a polishing liquid 1 (abrasive grain content: 0.2 mass %, polyvinyl alcohol content: 1.0 mass %). The above-described X mass % was determined such that the pH of the polishing liquid is 6.0. It is to be noted that the saponification degree of polyvinyl alcohol in the polyvinyl alcohol aqueous solution was 80 mol % and the average degree of polymerization was 300.

In the same manner, the slurry 2 (slurry obtained from storage liquid for slurry, which had been stored at 60° C. for 72 hours) and the additive liquid 2 were mixed to obtain a polishing liquid 2.

(Polishing of Insulating Film)

A φ200 mm silicon wafer on which a silicon oxide film as an insulating film is formed was set in a holder, to which an adsorption pad for mounting a base substrate is attached, of the polishing device. The holder was placed on a platen to which a porous urethane resin pad is attached such that the insulating film was opposed to the pad. The base substrate was pressed against the pad at a polishing load of 20 kPa while supplying the polishing liquid obtained as above onto the pad at an amount supplied of 200 mL/min. At this time, polishing was performed for 1 minute by rotating the platen at 78 min$^{-1}$ and the holder at 98 min$^{-1}$. The wafer after polishing was washed with pure water well and dried. With respect to each of the polishing liquids 1 and 2, the polishing rate was determined by measuring a change in the film thickness before and after polishing, using a light-interference film thickness meter. Moreover, a ratio of the difference between the polishing rate of the polishing liquid 1 and the polishing rate of the polishing liquid 2 to the polishing rate of the polishing liquid 1 (difference between polishing rates/polishing rate of polishing liquid 1×100) was calculated as a polishing rate change ratio. The results are shown in Table 3.

TABLE 3

| | Appearance Evaluation of Storage Liquid for Slurry | | pH of Storage Liquid for Slurry | | Polishing Rate [nm/min] | | Polishing Rate Change Ratio [%] |
|---|---|---|---|---|---|---|---|
| | Before Storing | After Storing | Before Storing | After Storing | Before Storing | After Storing | |
| Example 1 | Transparent and Very Faint Yellow | Transparent and Very Faint Yellow | 3.4 | 3.1 | 276 | 263 | 4.7 |
| Example 2 | Transparent and Very Faint Yellow | Transparent and Very Faint Yellow | 3.3 | 3.0 | 278 | 267 | 4.0 |
| Example 3 | Transparent and Very Faint Yellow | Transparent and Very Faint Yellow | 3.0 | 2.9 | 270 | 260 | 3.7 |
| Example 4 | Transparent and Very Faint Yellow | Transparent and Very Faint Yellow | 3.6 | 3.1 | 272 | 262 | 3.7 |
| Example 5 | Transparent and Very Faint Yellow | Transparent and Very Faint Yellow | 3.5 | 3.2 | 267 | 259 | 3.0 |
| Example 6 | Transparent and Very Faint Yellow | Transparent and Very Faint Yellow | 3.7 | 3.3 | 264 | 256 | 3.0 |
| Example 7 | Transparent and Very Faint Yellow | Transparent and Very Faint Yellow | 3.5 | 3.2 | 266 | 258 | 3.0 |
| Example 8 | Transparent and Very Faint Yellow | Transparent and Very Faint Yellow | 3.5 | 3.1 | 263 | 255 | 3.0 |
| Example 9 | Transparent and Very Faint Yellow | Transparent and Very Faint Yellow | 3.6 | 3.1 | 260 | 252 | 3.1 |
| Example 10 | Transparent and Very Faint Yellow | Transparent and Very Faint Yellow | 5.0 | 4.6 | 264 | 259 | 1.9 |
| Comparative Example 1 | Transparent and Faint Yellow | Transparent and Very Faint Yellow | 3.1 | 2.3 | 352 | 271 | 23.0 |
| Comparative Example 2 | Very Slightly Turbid and Faint Yellow | Very Slightly Turbid and Faint Yellow | 3.5 | 3.0 | 285 | 248 | 13.0 |
| Comparative Example 3 | Turbid and White | Turbid and White | 3.3 | 3.0 | 81 | 69 | 14.8 |
| Comparative Example 4 | Transparent and Faint Yellow | Transparent and Very Faint Yellow | 4.0 | 2.9 | 327 | 274 | 16.2 |

As is clear from Table 3, the polishing liquids of Examples have clear appearances even after storing at 60° C. for 72 hours and small polishing rate change ratios.

It is to be noted that the surface of the insulating film after polishing was washed for 1 minute by a PVA brush which was made to rotate at a rotational frequency of 60 min$^{-1}$ while supplying water, and then dried. The surface of the insulating film was observed using Surfscan 6220 manufactured by Tencor Corporation, and the number of polishing scratch having 0.2 μm or more on the surface of the insulating film was about 5 to 20 (scratch/wafer) in Examples 1 to 10, and polishing scratch were sufficiently suppressed.

(Polishing of Stopper Film and Polishing Rate Ratio)

With respect to the polishing liquid 1 obtained in Example 1, the polishing rate of a polysilicon film (stopper film) and the polishing selection ratio of a silicon oxide film (insulating film) with respect to the polysilicon film were determined.

Specifically, a φ200 mm silicon wafer on which a polysilicon film is formed was set in a holder, to which an adsorption pad for mounting a base substrate is attached, of the polishing device. The holder was placed on a platen to which a porous urethane resin pad is attached such that the polysilicon film was opposed to the pad. The base substrate was pressed against the pad at a polishing load of 20 kPa while supplying the polishing liquid 1 obtained in Example 1 onto the pad at an amount supplied of 200 mL/min. At this time, polishing was performed for 1 minute by rotating the platen at 78 min$^{-1}$ and the holder at 98 min$^{-1}$. The wafer after polishing was washed with pure water well and dried.

Next, the polishing rate of the polysilicon film was determined by measuring a change in the film thickness before and after polishing, using a light-interference film thickness meter, and it was 4 nm/min. The polishing selection ratio of the silicon oxide film with respect to the polysilicon film (polishing rate of silicon oxide film/polishing rate of polysilicon film) was 70.

(Effect of Additive and Impact on Polishing Rate)

With respect to a polishing liquid not comprising polyvinyl alcohol, the polishing rate of a silicon oxide film, the polishing rate of a polysilicon film, and the polishing selection ratio of the silicon oxide film with respect to the polysilicon film were determined.

Specifically, the additive liquid 1 and the additive liquid 2 were prepared in the same manner as the above except that 5 mass % polyvinyl alcohol was not comprised and the same mass % of water was added, and was mixed with the slurry 1 used in Example 1 to prepare a polishing liquid 1X. The polishing rate of the silicon oxide film, the polishing rate of the polysilicon film, and the polishing selection ratio of the silicon oxide film with respect to the polysilicon film were determined in the same manner as the above using the polishing liquid 1X, and the polishing rate of the silicon oxide film was 280 nm/min, the polishing rate of the polysilicon film was 80 nm/min, and the polishing selection ratio was 3.

According to the results, in the polishing liquid 1 of Example 1, while the polishing selection ratio was improved, the polishing rate of the insulating film was nearly-unchanged, compared with the polishing liquid 1X not comprising polyvinyl alcohol as an additive. Specifically, it was found that the polishing liquid 1 of Example 1 can polish a film to be polished at an excellent polishing rate while maintaining an addition effect of an additive.

The invention claimed is:

1. A slurry comprising:
   abrasive grains; and
   water, wherein
   the abrasive grains include a hydroxide of a tetravalent metal element, and produce absorbance of 1.00 or more and less than 1.50 for light having a wavelength of 400 nm in an aqueous dispersion having a content of the abrasive grains adjusted to 1.0 mass %.

2. The slurry according to claim 1, wherein the abrasive grains produce light transmittance of 50%/cm or more for light having a wavelength of 500 nm in an aqueous dispersion having a content of the abrasive grains adjusted to 1.0 mass %.

3. The slurry according to claim 1, wherein the abrasive grains produce light transmittance of 95%/cm or more for light having a wavelength of 500 nm in an aqueous dispersion having a content of the abrasive grains adjusted to 1.0 mass %.

4. The slurry according to claim 1, wherein the abrasive grains produce absorbance of 1.000 or more for light having a wavelength of 290 nm in an aqueous dispersion having a content of the abrasive grains adjusted to 0.0065 mass %.

5. The slurry according to claim 1, wherein the abrasive grains produce absorbance of 0.010 or less for light having a wavelength of 450 to 600 nm in an aqueous dispersion having a content of the abrasive grains adjusted to 0.0065 mass %.

6. The slurry according to claim 1, wherein the hydroxide of a tetravalent metal element is obtained by reacting a salt of a tetravalent metal element with an alkali source.

7. The slurry according to claim 1, wherein the tetravalent metal element is tetravalent cerium.

8. A polishing-liquid set wherein constituent components of a polishing liquid are separately stored as a first liquid and a second liquid such that the first liquid and the second liquid are mixed to form the polishing liquid, the first liquid is the slurry according to claim 1, and the second liquid comprises an additive and water.

9. The polishing-liquid set according to claim 8, wherein the additive is at least one selected from the group consisting of vinyl alcohol polymers and derivatives of the vinyl alcohol polymers.

10. The polishing-liquid set according to claim 8, wherein a content of the additive is 0.01 mass % or more based on a total mass of the polishing liquid.

11. A polishing liquid comprising:
    abrasive grains;
    an additive; and
    water, wherein
    the abrasive grains include a hydroxide of a tetravalent metal element, and produce absorbance of 1.00 or more and less than 1.50 for light having a wavelength of 400 nm in an aqueous dispersion having a content of the abrasive grains adjusted to 1.0 mass %.

12. The polishing liquid according to claim 11, wherein the abrasive grains produce light transmittance of 50%/cm or more for light having a wavelength of 500 nm in an aqueous dispersion having a content of the abrasive grains adjusted to 1.0 mass %.

13. The polishing liquid according to claim 11, wherein the abrasive grains produce light transmittance of 95%/cm or more for light having a wavelength of 500 nm in an aqueous dispersion having a content of the abrasive grains adjusted to 1.0 mass %.

14. The polishing liquid according to claim 11, wherein the abrasive grains produce absorbance of 1.000 or more for light having a wavelength of 290 nm in an aqueous dispersion having a content of the abrasive grains adjusted to 0.0065 mass %.

15. The polishing liquid according to claim 11, wherein the abrasive grains produce absorbance of 0.010 or less for light having a wavelength of 450 to 600 nm in an aqueous dispersion having a content of the abrasive grains adjusted to 0.0065 mass %.

16. The polishing liquid according to claim 11, wherein the hydroxide of a tetravalent metal element is obtained by reacting a salt of a tetravalent metal element with an alkali source.

17. The polishing liquid according to claim 11, wherein the tetravalent metal element is tetravalent cerium.

18. The polishing liquid according to claim 11, wherein the additive is at least one selected from the group consisting of vinyl alcohol polymers and derivatives of the vinyl alcohol polymers.

19. The polishing liquid according to claim 11, wherein a content of the additive is 0.01 mass % or more based on a total mass of the polishing liquid.

20. A base substrate polishing method comprising:
    a step of arranging a material to be polished of a base substrate having the material to be polished on a surface so as to be opposed to a polishing pad; and
    a step of polishing at least a part of the material to be polished by supplying the slurry according to claim 1 between the polishing pad and the material to be polished.

21. A base substrate polishing method comprising:
    a step of arranging a material to be polished of a base substrate having the material to be polished on a surface so as to be opposed to a polishing pad;

a step of obtaining the polishing liquid by mixing the first liquid and the second liquid of the polishing-liquid set according to claim 8; and a step of polishing at least a part of the material to be polished by supplying the polishing liquid between the polishing pad and the material to be polished.

22. A base substrate polishing method comprising:

a step of arranging a material to be polished of a base substrate having the material to be polished on a surface so as to be opposed to a polishing pad; and a step of polishing at least a part of the material to be polished by supplying each of the first liquid and the second liquid of the polishing-liquid set according to claim 8 between the polishing pad and the material to be polished.

23. A base substrate polishing method comprising:

a step of arranging a material to be polished of a base substrate having the material to be polished on a surface so as to be opposed to a polishing pad; and a step of polishing at least a part of the material to be polished by supplying the polishing liquid according to claim 11 between the polishing pad and the material to be polished.

24. The polishing method according to claim 20, wherein the material to be polished includes silicon oxide.

25. The polishing method according to claim 20, wherein irregularities are formed on a surface of the material to be polished.

26. A base substrate polished by the polishing method according to claim 20.

27. The polishing method according to claim 21, wherein the material to be polished includes silicon oxide.

28. The polishing method according to claim 21, wherein irregularities are formed on a surface of the material to be polished.

29. A base substrate polished by the polishing method according to claim 21.

30. The polishing method according to claim 22, wherein the material to be polished includes silicon oxide.

31. The polishing method according to claim 22, wherein irregularities are formed on a surface of the material to be polished.

32. A base substrate polished by the polishing method according to claim 22.

33. The polishing method according to claim 23, wherein the material to be polished includes silicon oxide.

34. The polishing method according to claim 23, wherein irregularities are formed on a surface of the material to be polished.

35. A base substrate polished by the polishing method according to claim 23.

* * * * *